US009960264B1

(12) United States Patent
Chen et al.

(10) Patent No.: US 9,960,264 B1
(45) Date of Patent: May 1, 2018

(54) HIGH ELECTRON MOBILITY TRANSISTOR

(71) Applicant: Wavetek Microelectronics Corporation, Hsinchu County (TW)

(72) Inventors: Chih-Yen Chen, Tainan (TW); Hsien-Lung Yang, Taipei (TW)

(73) Assignee: Wavetek Microelectronics Corporation, Hsinchu County (TW)

(*) Notice: Subject to any disclaimer, the term of this patent is extended or adjusted under 35 U.S.C. 154(b) by 0 days. days.

(21) Appl. No.: 15/609,031

(22) Filed: May 31, 2017

(30) Foreign Application Priority Data

Mar. 31, 2017 (TW) .............................. 106110975 A

(51) Int. Cl.
| | | |
|---|---|---|
| *H01L 29/00* | (2006.01) | |
| *H01L 29/778* | (2006.01) | |
| *H01L 29/423* | (2006.01) | |
| *H01L 29/207* | (2006.01) | |
| *H01L 29/10* | (2006.01) | |
| *H01L 29/66* | (2006.01) | |
| *H01L 29/06* | (2006.01) | |
| *H01L 29/20* | (2006.01) | |

(52) U.S. Cl.
CPC ...... *H01L 29/7786* (2013.01); *H01L 29/0661* (2013.01); *H01L 29/10* (2013.01); *H01L 29/2003* (2013.01); *H01L 29/207* (2013.01); *H01L 29/4236* (2013.01); *H01L 29/42376* (2013.01); *H01L 29/66462* (2013.01)

(58) Field of Classification Search
CPC ............. H01L 29/7787; H01L 29/7786; H01L 29/42376; H01L 29/66462
See application file for complete search history.

(56) References Cited

U.S. PATENT DOCUMENTS

| | | |
|---|---|---|
| 7,019,336 B2 | 3/2006 | Yamashita |
| 7,638,818 B2 | 12/2009 | Wu |
| 7,692,263 B2 | 4/2010 | Wu |
| 7,932,539 B2 | 4/2011 | Chen |
| 7,955,918 B2 | 6/2011 | Wu |
| 7,972,915 B2 | 7/2011 | Chen |
| 8,044,432 B2 | 10/2011 | Chen |
| 8,076,699 B2 | 12/2011 | Chen |
| 8,124,505 B1 | 2/2012 | Burnham |
| 8,283,699 B2 | 10/2012 | Wu |
| 8,502,323 B2 | 8/2013 | Chen |
| 8,624,296 B1 | 1/2014 | Wong |
| 8,633,094 B2 | 1/2014 | Ramdani |
| 8,633,494 B2 | 1/2014 | Nishimori |

(Continued)

*Primary Examiner* — Thomas L Dickey
(74) *Attorney, Agent, or Firm* — Winston Hsu

(57) ABSTRACT

A high electron mobility transistor includes a first III-V compound layer, a second III-V compound layer, a source electrode, a drain electrode, a gate electrode, a first moat, and a second moat. The second III-V compound layer is disposed on the first III-V compound layer. The source electrode and the drain electrodes are disposed above the first III-V compound layer. The gate electrode is disposed above the second III-V compound layer located between the source and the drain electrodes in a first direction. The second III-V compound layer includes a first region under the gate electrode. The first moat is at least partially disposed between the first region and the source electrode in the first direction. The second moat is at least partially disposed between the first region and the drain electrode in the first direction.

24 Claims, 33 Drawing Sheets

(56) References Cited

U.S. PATENT DOCUMENTS

| | | | |
|---|---|---|---|
| 8,912,571 B2 | 12/2014 | Kanamura | |
| 9,111,905 B2 | 8/2015 | Yao | |
| 2006/0049427 A1* | 3/2006 | Takahashi | H01L 27/0605 257/194 |
| 2006/0208279 A1* | 9/2006 | Robinson | H01L 29/66462 257/194 |
| 2006/0255377 A1* | 11/2006 | Tu | H01L 29/402 257/280 |
| 2012/0146046 A1* | 6/2012 | Ohki | H01L 29/4236 257/76 |

* cited by examiner

HIGH ELECTRON MOBILITY TRANSISTOR

BACKGROUND OF THE INVENTION

1. Field of the Invention

The present invention relates to a high electron mobility transistor (HEMT), and more particularly, to an HEMT including a moat.

2. Description of the Prior Art

Because of the semiconductor characteristics, III-V semiconductor compounds may be applied in many kinds of integrated circuit devices, such as high power field effect transistors, high frequency transistors, or high electron mobility transistors (HEMTs). In the high electron mobility transistor, two semiconductor materials with different bandgaps are combined and heterojunction is formed at the junction between the semiconductor materials as a channel for carriers. In recent years, gallium nitride (GaN) based materials have been applied in the high power and high frequency products because of the properties of wider bandgap and high saturation velocity. Two-dimensional electron gas (2DEG) may be generated by the piezoelectricity property of the GaN-based materials, and the switching velocity may be enhanced because of the higher electron velocity and the higher electron density of the 2DEG. However, heat effect may be generated at the channel because of the higher electric current during the high frequency operations, the reliability of the HEMT may become lowered, and the quality of the HEMT may be influenced accordingly.

SUMMARY OF THE INVENTION

It is one of the objectives of the present invention to provide a high electron mobility transistor (HEMT). A moat formed in a second III-V compound layer is used to control the distribution of a two-dimensional electron gas (2DEG) and/or the electric field distribution, and the electrical performance and/or the reliability of the HEMT may be enhanced accordingly.

A high electron mobility transistor is provided in an embodiment of the present invention. The high electron mobility transistor includes a first III-V compound layer, a second III-V compound layer, a source electrode, a drain electrode, a gate electrode, a first moat, and a second moat. The second III-V compound layer is disposed on the first III-V compound layer. The second III-V compound layer is different from the first III-V compound layer in composition. The source electrode and the drain electrode are disposed above the second III-V compound layer. The gate electrode is disposed over the second III-V compound layer located between the source electrode and the drain electrode in a first direction. The second III-V compound layer includes a first region disposed under the gate electrode. The first moat is at least partially disposed in the second III-V compound layer and at least partially disposed between the first region and the source electrode in the first direction. The second moat is at least partially disposed in the second III-V compound layer and at least partially disposed between the first region and the drain electrode in the first direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
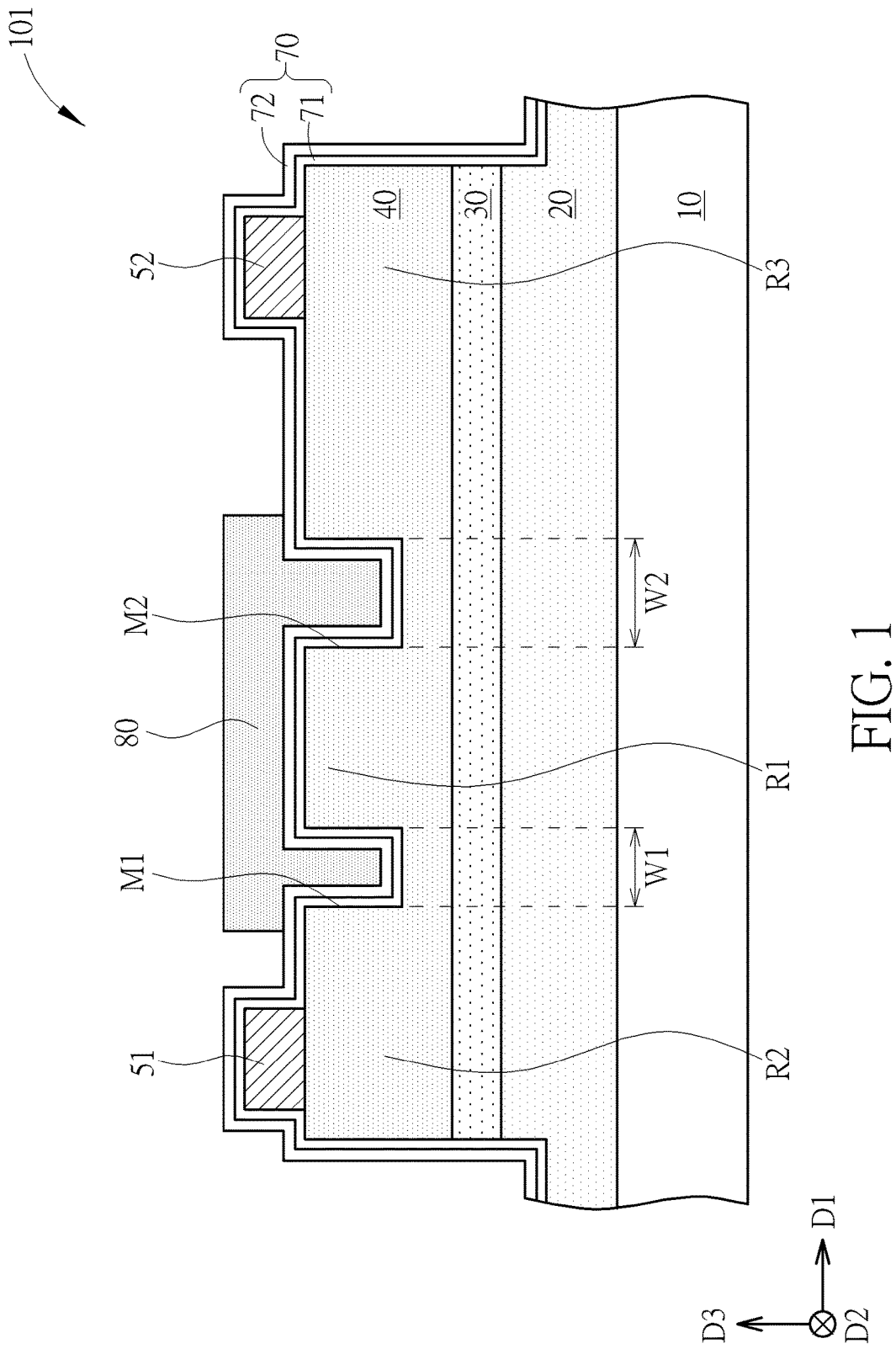
FIG. 1 is a schematic drawing illustrating a high electron mobility transistor (HEMT) according to a first embodiment of the present invention.

Please refer to FIG. 1. FIG. 1 is a schematic drawing illustrating a high electron mobility transistor (HEMT) according to a first embodiment of the present invention. As shown in FIG. 1, an HEMT 101 is provided in this embodiment. The HEMT 101 includes a first III-V compound layer 30, a second III-V compound layer 40, a source electrode 51, a drain electrode 52, a gate electrode 80, a first moat M1, and a second moat M2. The second III-V compound layer 40 is disposed on the first III-V compound layer 30. The second III-V compound layer 40 is different from the first III-V compound layer 30 in composition. For example, the first III-V compound layer 30 may be used as a channel layer in the HEMT 101 and may be formed by materials such as gallium nitride (GaN) and/or indium gallium nitride (InGaN), and the second III-V compound layer 40 may be used as a barrier layer in the HEMT 101 and may be formed by materials such as aluminum gallium nitride (AlGaN), aluminum indium nitride (AlInN) and/or aluminum nitride (AlN), but not limited thereto. In some embodiments, other kinds of III-V compounds except the materials mentioned above may also be used to form the first III-V compound layer 30 and the second III-V compound layer 40 according to other considerations. The source electrode 51 and the drain electrode 52 are disposed above the first III-V compound layer 30, and the gate electrode 80 is disposed over the second III-V compound layer 40 located between the source electrode 51 and the drain electrode 52 in a first direction D1. In some embodiments, the source electrode 51 and the drain electrode 52 may be disposed above the second III-V compound layer 40, but not limited thereto. In some embodiments, the source electrode 51 and the drain electrode 52 may be disposed above the first III-V compound layer 30 without being disposed above the second III-V compound layer 40 according to other considerations. The source electrode 51, the drain electrode 52, and the gate electrode 80 may include conductive metal materials or other suitable conductive materials respectively. The conductive metal materials mentioned above may include gold (Au), tungsten (W), cobalt (Co), nickel (Ni), titanium (Ti), molybdenum (Mo), copper (Cu), aluminum (Al), tantalum (Ta), palladium (Pd), platinum (Pt), a compound of the above-mentioned materials, a stack layer of the above-mentioned materials, or an alloy of the above-mentioned materials, but not limited thereto. In some embodiments, the HEMT 101 may further include a gate dielectric layer 70 disposed on the second III-V compound layer 40, a part of the gate dielectric layer 70 may be disposed between the second III-V compound layer 40 and the gate electrode 80 in a vertical direction D3, and the gate dielectric layer 70 may extend to cover the source electrode 51, the drain electrode 51, a side surface of the first III-V compound layer 30, and a side surface of the second III-V compound layer 40, but not limited thereto. In some embodiments, the gate dielectric layer 70 may be a single layer structure or a structure of stacked multiple material layers. For example, the gate dielectric layer 70 may include a first dielectric layer 71 and a second dielectric layer 72, but not limited thereto. The material of the gate dielectric layer 70 may include aluminum nitride, silicon nitride (such as $Si_3N_4$), silicon oxide (such as $SiO_2$), aluminum oxide (such as $Al_2O_3$), hafnium oxide (such as $HfO_2$), lanthanum oxide (such as $La_2O_3$), lutetium oxide (such as $Lu_2O_3$), lanthanum lutetium oxide (such as $LaLuO_3$), or other appropriate dielectric materials.

The second III-V compound layer 40 may include a first region R1, a second region R2, and a third region R3. The first region R1 is disposed under the gate electrode 80, the second region R2 is disposed under the source electrode 51, and the third region R3 is disposed under the drain electrode 52. The first moat M1 and the second moat M2 are at least partially disposed in the second III-V compound layer 40. The first moat M1 may be at least partially disposed between the first region R1 of the second III-V compound layer 40 and the source electrode 51 in the first direction D1, and the second moat M2 may be at least partially disposed between the first region R1 of the second III-V compound layer 40 and the drain electrode 52 in the first direction D1. When the source electrode 51 and the drain electrode 52 are disposed above the second III-V compound layer 40, the first moat M1 may be at least partially disposed between the first region R1 and the second region R2 of the second III-V compound layer 40 in the first direction D1, and the second moat M2 may be at least partially disposed between the first region R1 and the third region R3 of the second III-V compound layer 40 in the first direction D1. In other words, the firs moat M1 is disposed at a side adjacent to the source electrode 51, the second moat M2 is disposed at a side adjacent to the drain electrode 52, and the first region R1 disposed under the gate electrode is located between the first moat M1 and the second moat M2 in the first direction D1. Therefore, the first moat M1 and the second moat M2 formed in the second III-V compound layer 40 may be used to control or alter the two-dimensional electron gas (2DEG) and the electric field distribution formed between the second III-V compound layer 40 and the first III-V compound layer 30, and the electrical performance of the HEMT 101 and/or the reliability of the HEMT 101 may be improved accordingly. For example, the stability of the threshold voltage (Vth) and the hysteresis of the threshold voltage may be improved accordingly. Additionally, in some embodiments, the depths of the first moat M1 and the second moat M2 may be controlled for some considerations. For instance, the first moat M1 and the second moat M2 may penetrate the second III-V compound layer 40 respectively (not shown). In some embodiments, the first moat M1 and the second moat M2 do not penetrate the second III-V compound layer 40 for avoiding generating damage to the channel region by the etching process of forming the first moat M1 and the second moat M2 and reducing the charge trapping effect in the area under the gate electrode, and the reliability of the HEMT 101 may be further improved accordingly.

As shown in FIG. 1, the HEMT 101 may further include a buffer layer 20 disposed under the first III-V compound layer 30, and the HEMT 101 may be disposed on a substrate 10, but not limited thereto. In some embodiments, the buffer layer 20 may include gallium nitride, aluminum gallium nitride, or other suitable buffer materials. The substrate 10 may include silicon substrate, silicon carbide substrate, gallium nitride substrate, sapphire substrate, or substrate formed by other appropriate materials. Additionally, the electric field distribution may be modified by controlling the dimension of the gate electrode 80, the distance between the gate electrode 80 and the source electrode 51, the distance between the gate electrode 80 and the drain electrode 52, and/or the dimensions of the first moat M1 and the second moat M2 for enhancing the breakdown voltage of the HEMT 101. For example, a length of the first moat M1 in the first direction D1 (such as a first length W1 shown in FIG. 1) may be shorter than a length of the second moat M2 in the first direction D1 (such as a second length W2 shown in FIG. 1), but not limited thereto. In some embodiments of the present invention, the first length W1 of the first moat M1 may also be longer than or equal to the second length W2 of the second moat M2 according to other considerations. Additionally, in some embodiments, the gate electrode 80 may extend for being partially disposed in the first moat M1 and/or the second moat M2. The gate electrode 80 may extend towards the source electrode 51 and overlap a part of the second III-V compound layer 40 disposed between the first moat M1 and the source electrode 51 in the vertical direction D3. The gate electrode 80 may also extend towards the drain electrode 52 and overlap a part of the second III-V compound layer 40 disposed between the second moat M2 and the drain electrode 52 in the vertical direction D3. In some embodiments, the first moat M1 and/or the second moat M2 may be filled with the gate dielectric layer 70 and the gate electrode 80, but not limited thereto.

Figure 2:
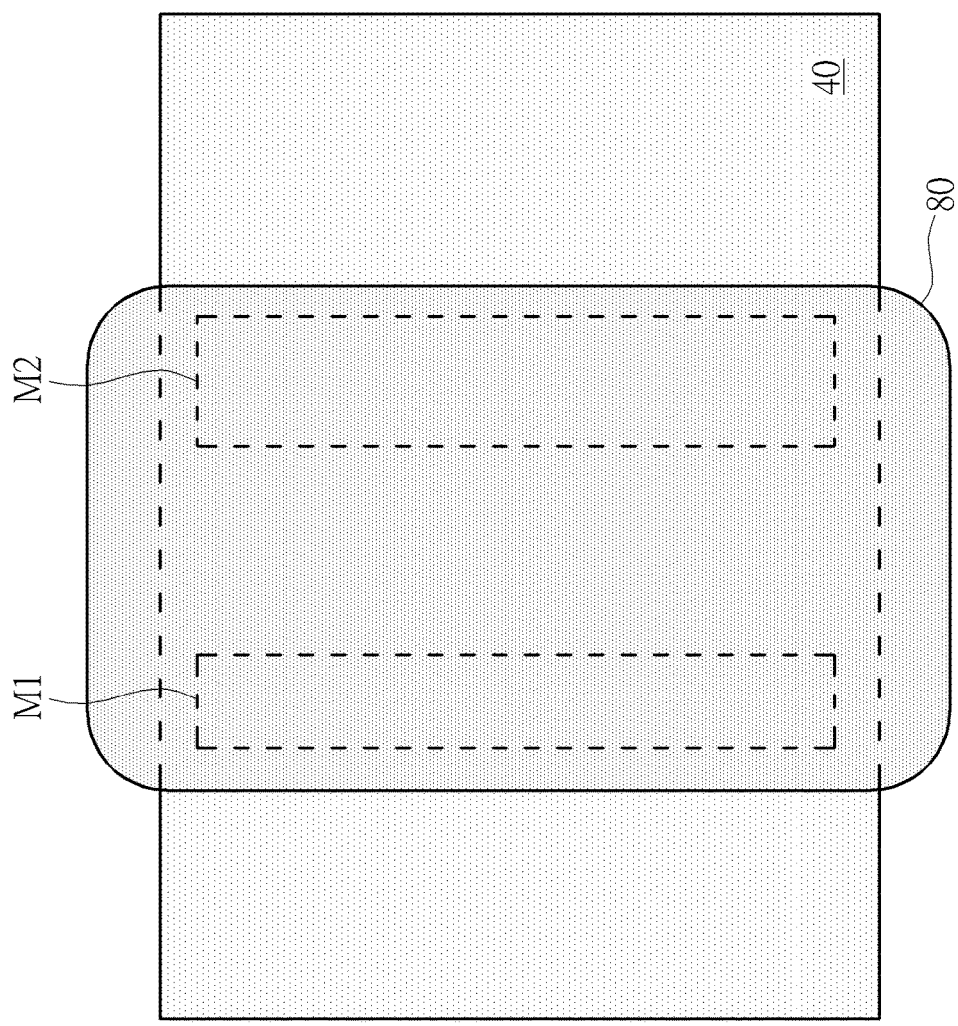
FIG. 2 is a top view schematic drawing illustrating an example of the HEMT according to the first embodiment of the present invention.
Figure 3:
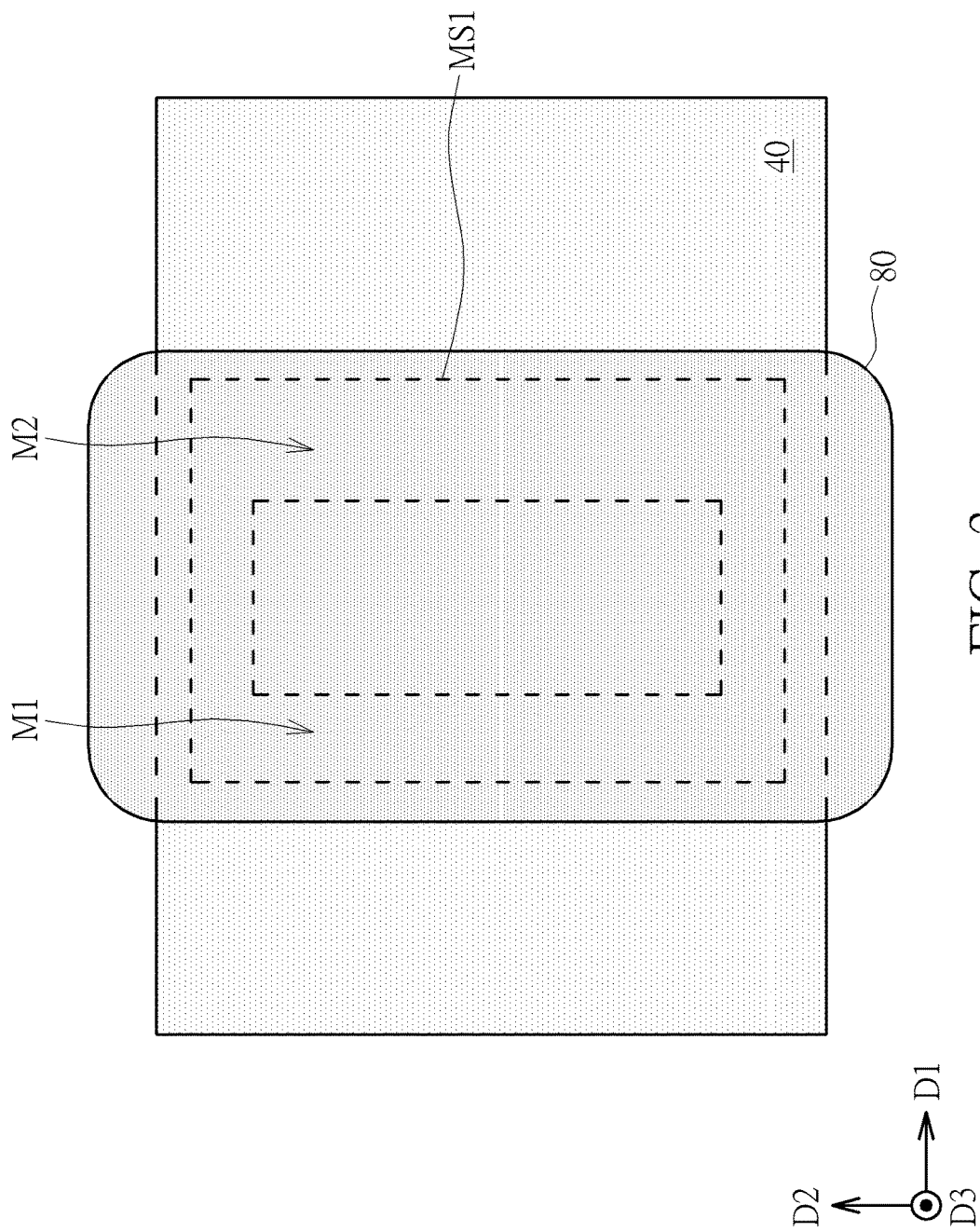
FIG. 3 is a top view schematic drawing illustrating another example of the HEMT according to the first embodiment of the present invention.

Please refer to FIGS. 1-3. FIG. 2 is a top view schematic drawing illustrating an example of the HEMT 101 in this embodiment, and FIG. 3 is a top view schematic drawing illustrating another example of the HEMT 101 in this embodiment. As shown in FIG. 1 and FIG. 2, in some examples, the first moat M1 and the second moat M2 may be separated from each other. For instance, the first moat M1 and the second moat M2 may respectively be a stripe moat extending in a second direction D2 perpendicular to the first direction D1, but not limited thereto. As shown in FIG. 1 and FIG. 3, in some examples, the first moat M1 and the second moat M2 may be connected to each other and form a first moat structure MS1. The first moat structure MS1 may be a closed moat surrounding a part of the second III-V compound layer 40. In other words, the first moat structure MS1 includes the first moat M1 and the second moat M2 described above, and the first moat structure MS1 surrounds the first region R1 of the second III-V compound layer 40 in the first direction D1 and the second direction D2. The 2DEG and the electric field distribution may be further controlled and/or altered by the first moat structure MS1 surrounding the part of the second III-V compound layer 40 under the gate electrode 80, and that will benefit the electrical performance and the reliability of the HEMT 101. Additionally, it is worth noting that the allocation of the first moat M1 and the second moat M2 separated from each other as shown in FIG. 2 and the allocation of the first moat M1 and the second moat M2 connected to each other to be the first moat structure MS1 as shown in FIG. 3 may also be applied to other embodiments of the present inventions.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 4:
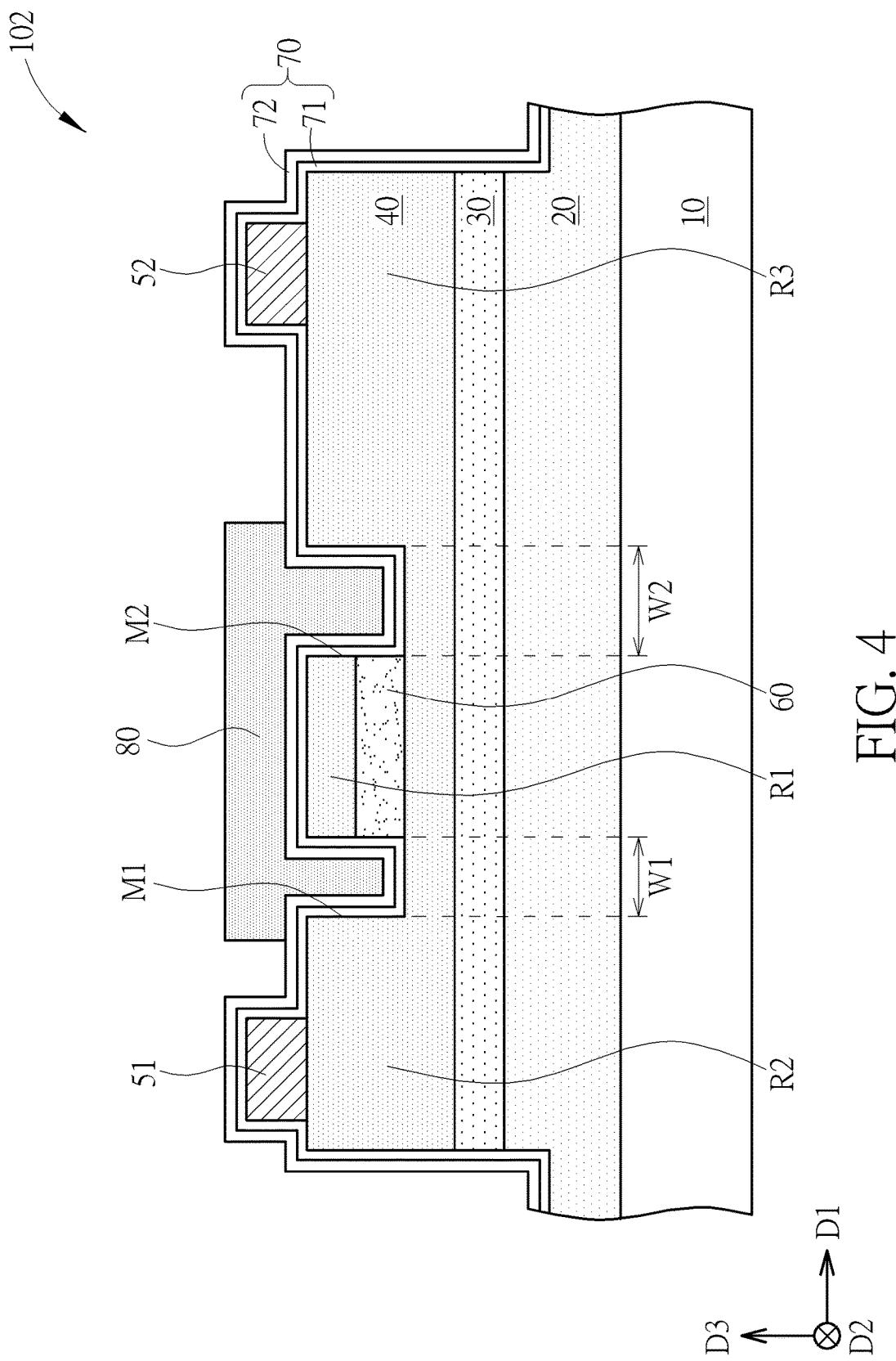
FIG. 4 is a schematic drawing illustrating an HEMT according to a second embodiment of the present invention.

Please refer to FIG. 4. FIG. 4 is a schematic drawing illustrating an HEMT according to a second embodiment of the present invention. As shown in FIG. 4, the difference between an HEMT 102 in this embodiment and the HEMT in the first embodiment mentioned above is that the HEMT 102 may further include a fluorine region 60 disposed in the second III-V compound layer 40. At least a part of the fluorine region 60 may be disposed in the first region R1 of the second III-V compound layer 40, but not limited thereto. The fluorine region 60 may include fluorine ions therein, and the fluorine ions may provide static and strong negative charge for effective depleting electrons of the carrier channel. The carrier concentration may become lowered or the channel may be interrupt, the carrier channel may become normally-off, and the HEMT 102 may be a normally-off transistor, but not limited thereto. The dimension and the depth of the fluorine region 60 may be controlled by modifying the process parameters of the process for forming the fluorine region 60, such as an ion implantation. For example, the topmost surface of the fluorine region 60 may be lower than the topmost surface of the second III-V compound layer 40, and the bottommost surface of the fluorine region 60 may be higher than the bottommost surface of the second III-V compound layer 40, but not limited thereto. In some embodiments, the fluorine region 60 may contact the topmost surface of the second III-V compound layer 40 and/or the bottommost surface of the second III-V compound layer 40. In some embodiments, the fluorine region 60 can penetrate into the first III-V compound layer 30. In some embodiments, at least a part of the fluorine region 60 may be disposed between the first moat M1 and the second moat M2 in the first direction D1. The first moat M1 and the second moat M2 may form a physical restriction for reducing migrations of the fluorine ions in the fluorine region 60 with the driving force of generated heat and/or electrical field especially under long time operation of the HEMT 102. The reliability of the HEMT 102 may be effectively enhanced by the restriction of the migration, and the electrical performance of the HEMT 102 may be improved also because the first moat M1 and the second moat M2 may also be used to control and/or alter the electric field distribution. Additionally, in some embodiments, the bottom surfaces of the first moat M1 and the second moat M2 may be substantially located at the same level with the bottommost surface of the fluorine region 60, but not limited thereto. In some embodiments of the present invention, the bottom surfaces of the first moat M1 and the second moat M2 may also be higher than or lower than the bottommost surface of the fluorine region 60 according to some considerations, and the bottom surfaces of the first moat M1 and the second moat M2 may be even higher than the topmost surface of the fluorine region 60. Apart from forming the physical restriction to the migration of the fluorine region 60, the first moat M1 and the second moat M2 may also be used to redistribute and/or reshape the electric field, such as the strong electric field between the gate electrode 80 and the drain electrode 52, for blocking the migration of the fluorine region 60. The process window of forming the first moat M1 and the second moat M2 may be more flexible because specific effects of suppressing the migration of the fluorine region 60 and/or controlling the electric field may be formed no matter how deep the first moat M1 and the second moat M2 are. In some embodiments, the fluorine region 60 may not contact the first moat M1 and/or the second moat M2 directly, but not limited thereto.

Figure 5:
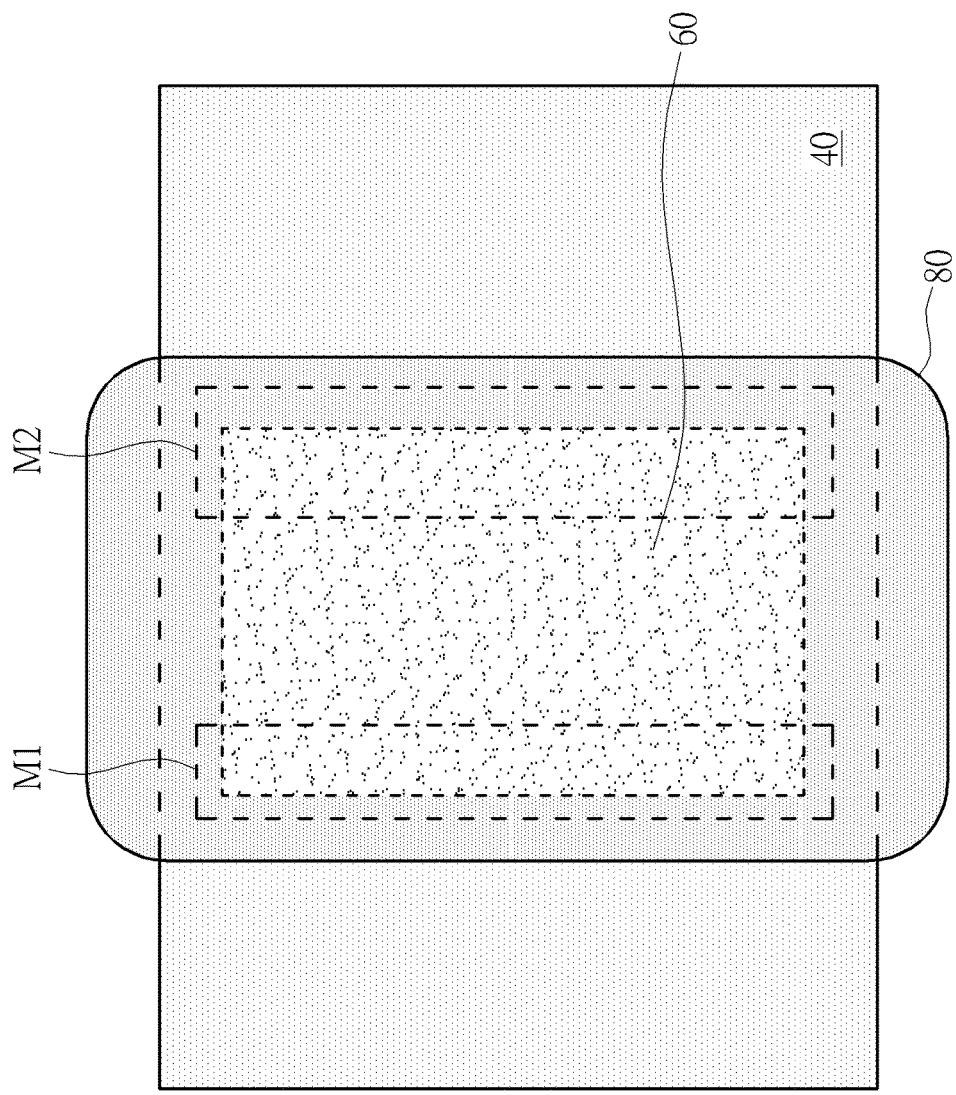
FIG. 5 is a top view schematic drawing illustrating an example of the HEMT according to the second embodiment of the present invention.
Figure 6:
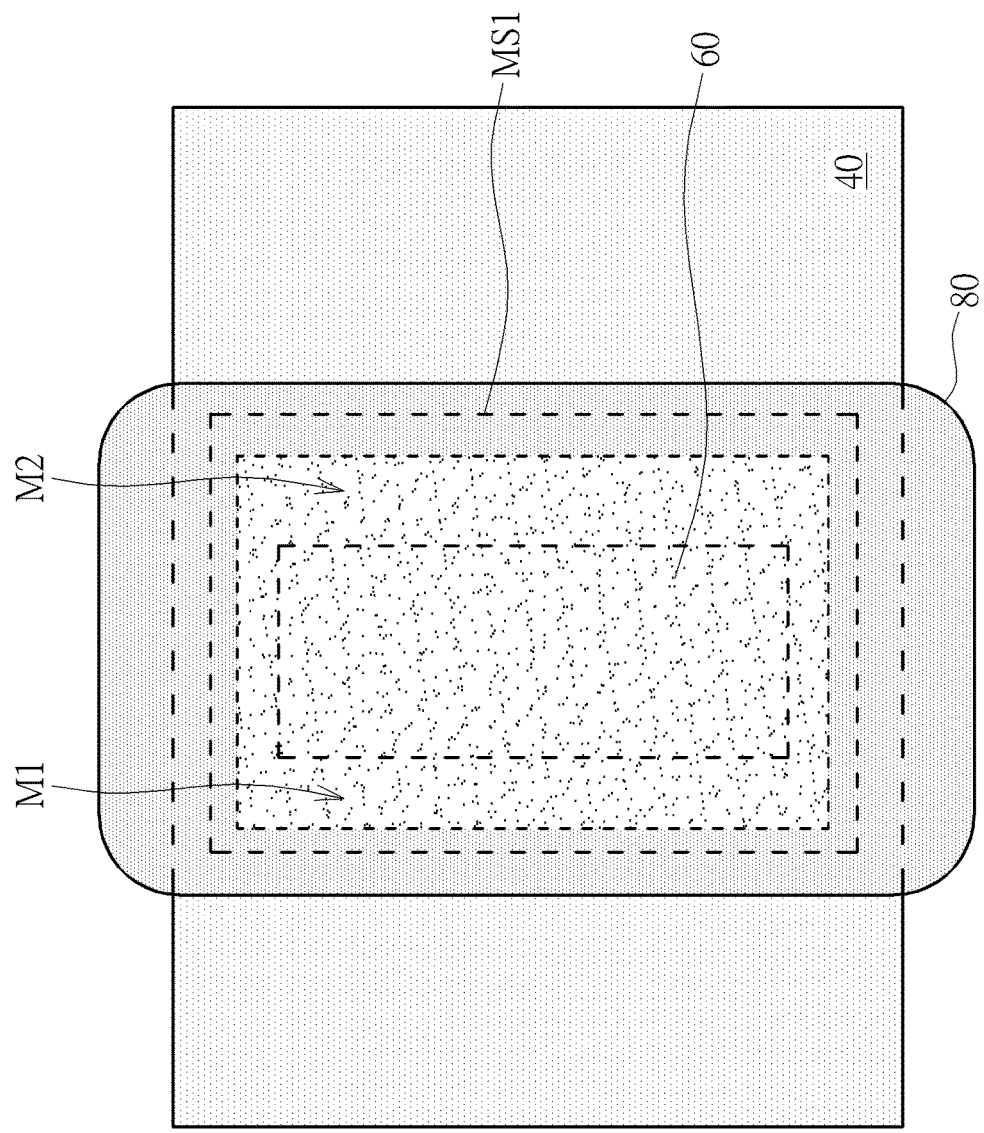
FIG. 6 is a top view schematic drawing illustrating another example of the HEMT according to the second embodiment of the present invention.

Please refer to FIGS. 4-6. FIG. 5 is a top view schematic drawing illustrating an example of the HEMT 102 in this embodiment, and FIG. 6 is a top view schematic drawing illustrating another example of the HEMT 102 in this embodiment. As shown in FIG. 4 and FIG. 5, in some examples, the first moat M1 and the second moat M2 may be separated from each other. For instance, the first moat M1 and the second moat M2 may respectively be a stripe moat extending in the second direction D2, and at least a part of the fluorine region 60 may be disposed between the first moat M1 and the second moat M2 in the first direction D1, but not limited thereto. As shown in FIG. 4 and FIG. 6, in some examples, the first moat M1 and the second moat M2 may be connected to each other and form the first moat structure MS1. The first moat structure MS1 may surround the first region R1 of the second III-V compound layer 40 and at least a part of the fluorine region 60 in the first direction D1 and the second direction D2. The effect of suppressing the migration of the fluorine region 60 may be further improved because of the formation of the first moat structure MS1 surrounding at least a part of the fluorine region 60, and the reliability may be further enhanced accordingly.

Figure 7:
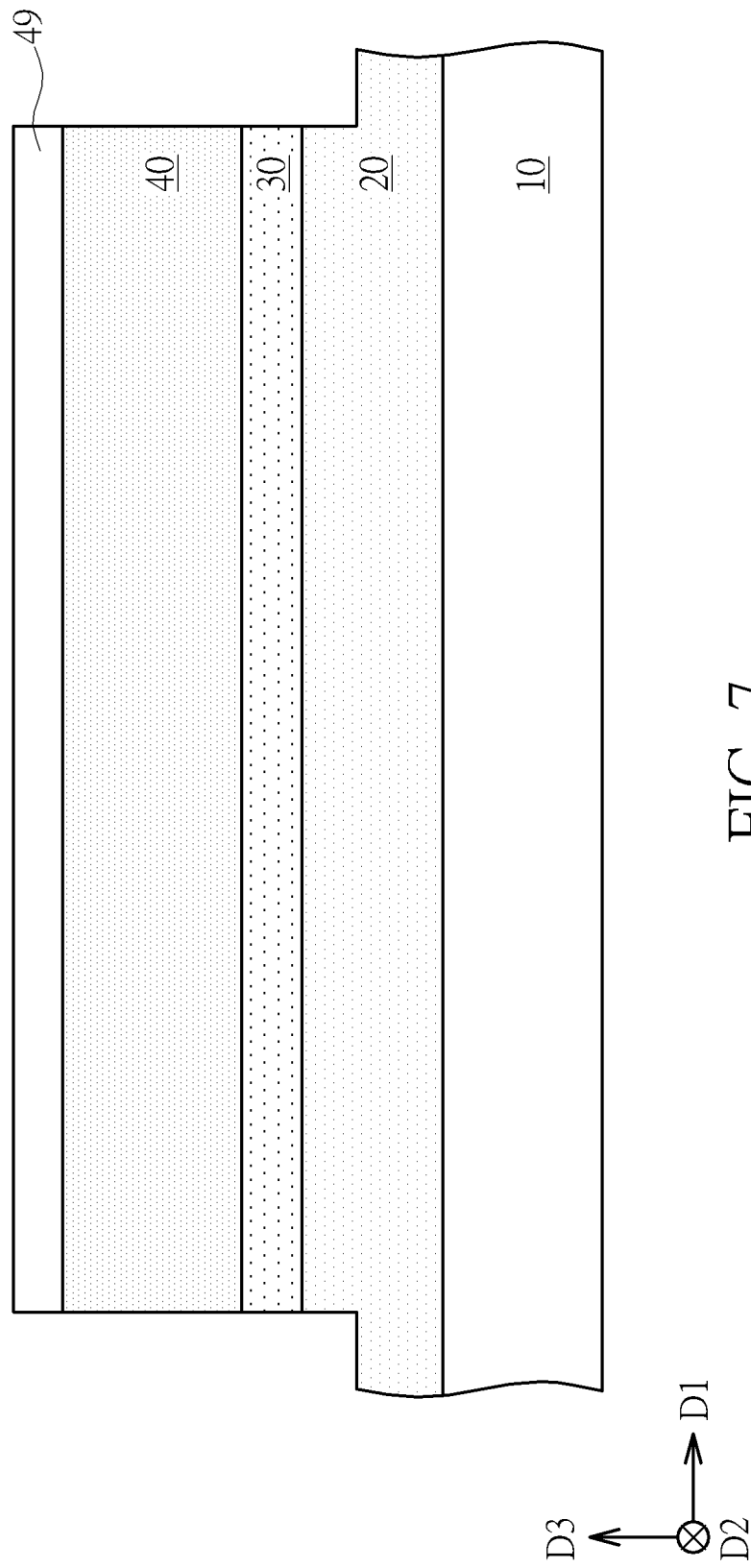
FIG. 7 is a schematic drawing illustrating a manufacturing method of the HEMT according to the second embodiment of the present invention.
Figure 8:
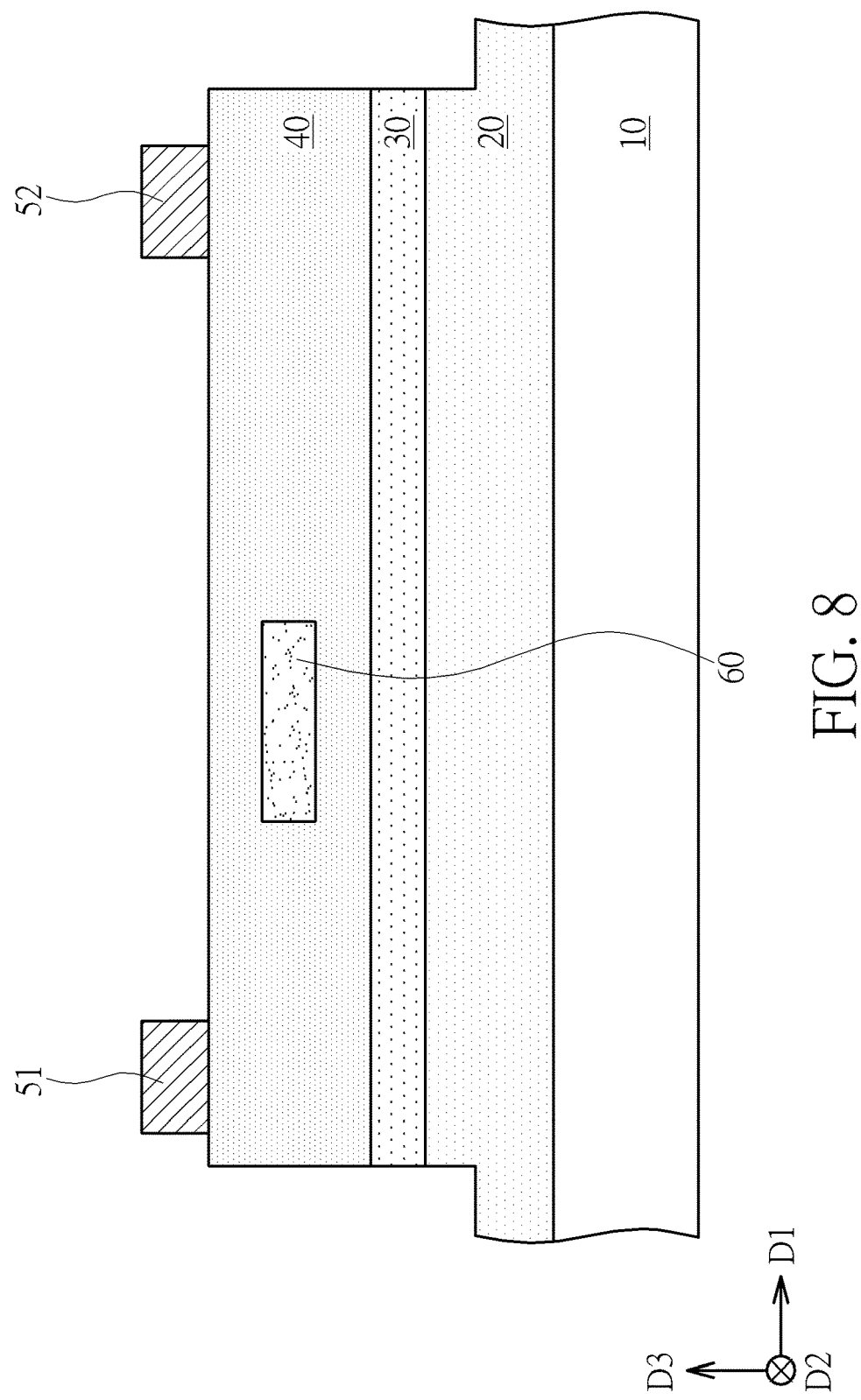
FIG. 8 is a schematic drawing in a step subsequent to FIG. 7.
Figure 9:
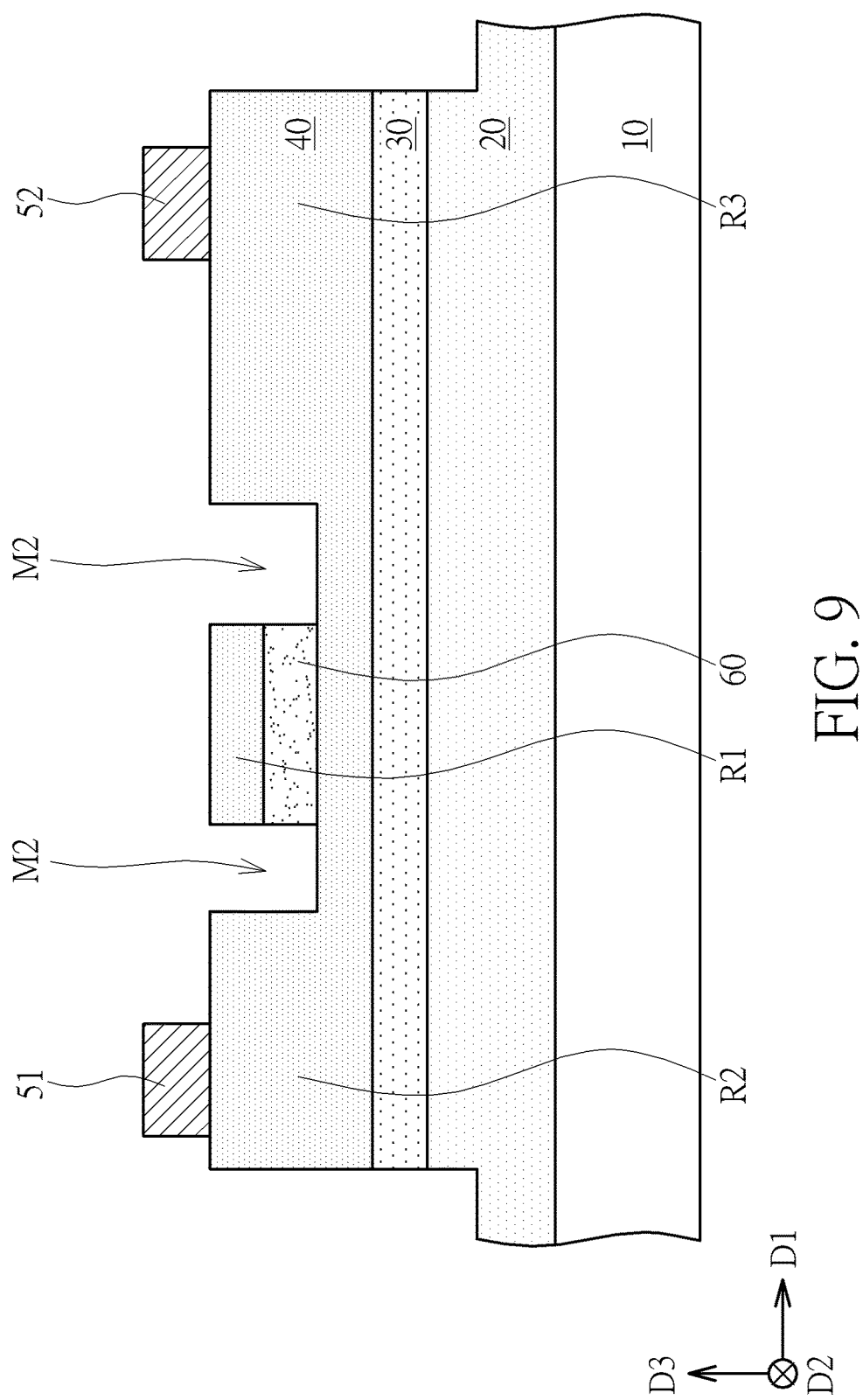
FIG. 9 is a schematic drawing in a step subsequent to FIG. 8.

Please refer to FIG. 4 and FIGS. 7-9. FIGS. 7-9 are schematic drawings illustrating a manufacturing method of the HEMT 102 in this embodiment. The manufacturing method of the HEMT 102 in this embodiment may include but is not limited to the following steps. As shown in FIG. 7, the buffer layer 40, the first III-V compound layer 30, and the second III-V compound layer 40 are sequentially formed on the substrate 10. A mask layer such as a dielectric capping layer 49 is formed on the second III-V compound layer 40, and an etching process is performed to etch the buffer layer 40, the first III-V compound layer 30, and the second III-V compound layer 40 with the dielectric capping layer 49 as a mask for forming a mesa structure. As shown in FIG. 7 and FIG. 8, the source electrode 51 and the drain electrode 52 are formed on the second III-V compound layer 40 after removing the dielectric capping layer 49, and the fluorine region 60 is formed in the second III-V compound layer 40. As shown in FIG. 9, the first moat M1 and the second moat M2 are formed. Subsequently, as shown in FIG. 4, the gate dielectric layer 70 and the gate electrode 80 are formed. It is worth noting that the fluorine region 60 may be formed before the step of forming the first moat M1 and the second moat M2, but not limited thereto. In some embodiments, the first moat M1 and the second moat M2 may be formed before the step of forming the fluorine region 60 according to some considerations.

Figure 10:
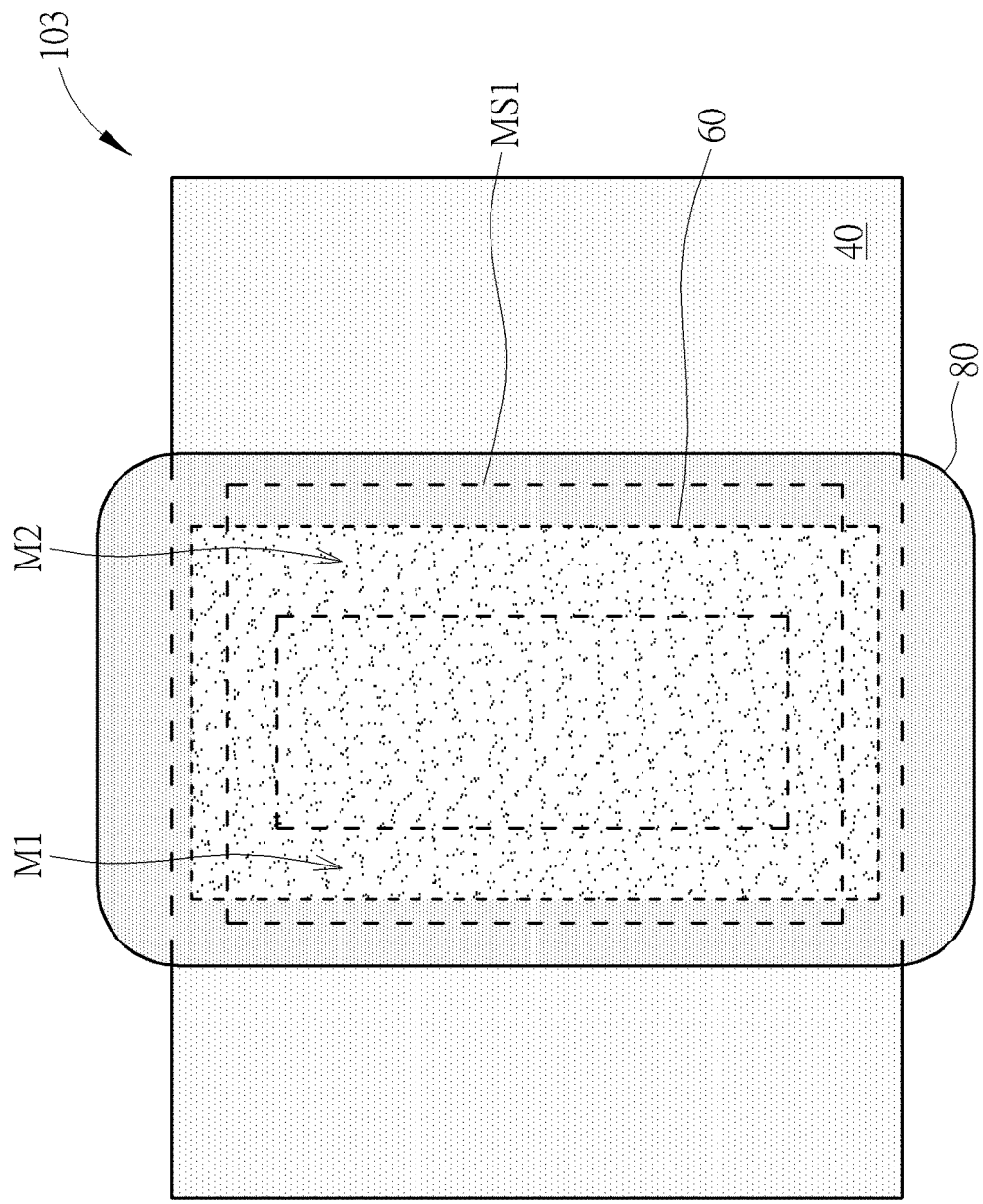
FIG. 10 is a schematic drawing illustrating an HEMT according to a third embodiment of the present invention.

Please refer to FIG. 10. FIG. 10 is a schematic drawing illustrating an HEMT according to a third embodiment of the present invention. As shown in FIG. 10, the difference between an HEMT 103 in this embodiment and the HEMT in the second embodiment mentioned above is that the fluorine region 60 in this embodiment may further extend in the second direction D2 for being partly disposed outside the first moat structure MS1 composed of the first moat M1 and the second moat M2 and generating depleting effect on the channel region in this area accordingly.

Figure 11:
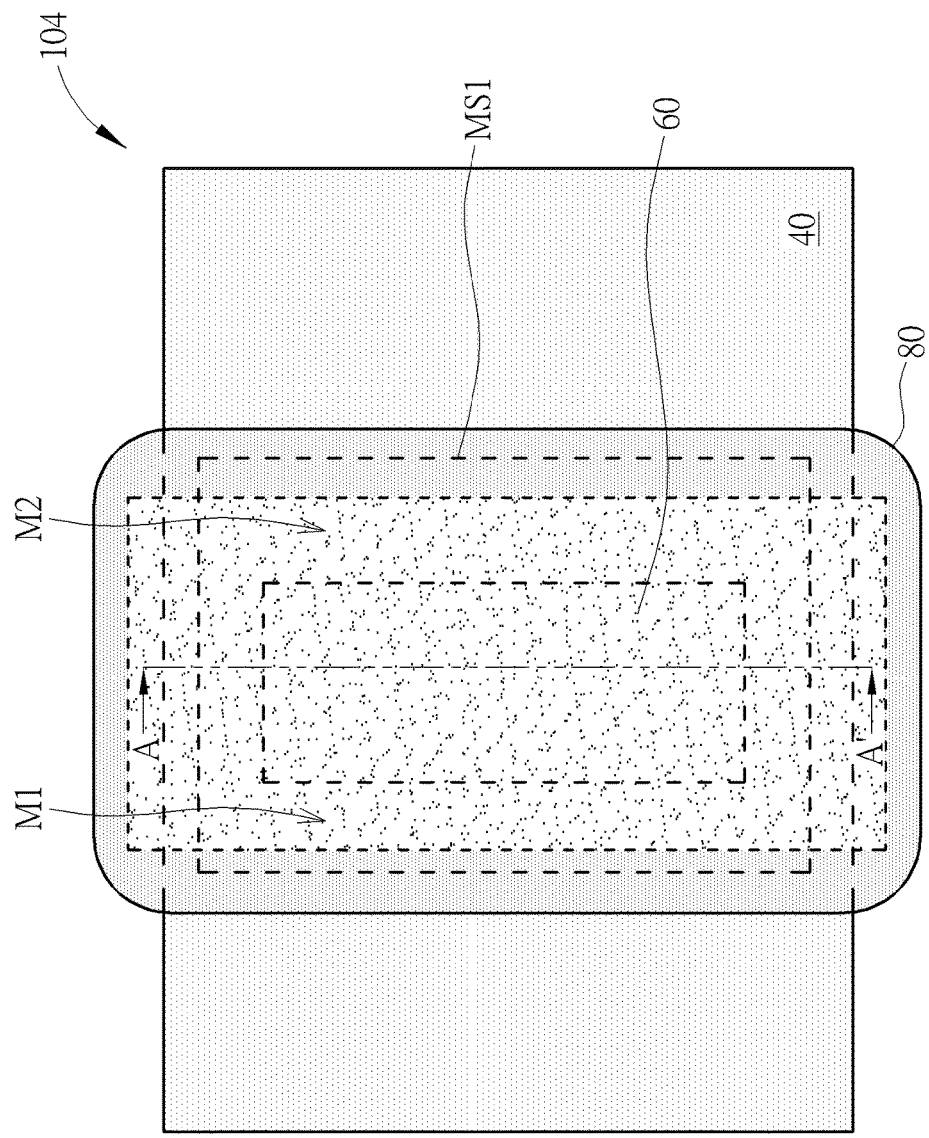
FIG. 11 is a top view schematic drawing illustrating an HEMT according to a fourth embodiment of the present invention.
Figure 12:
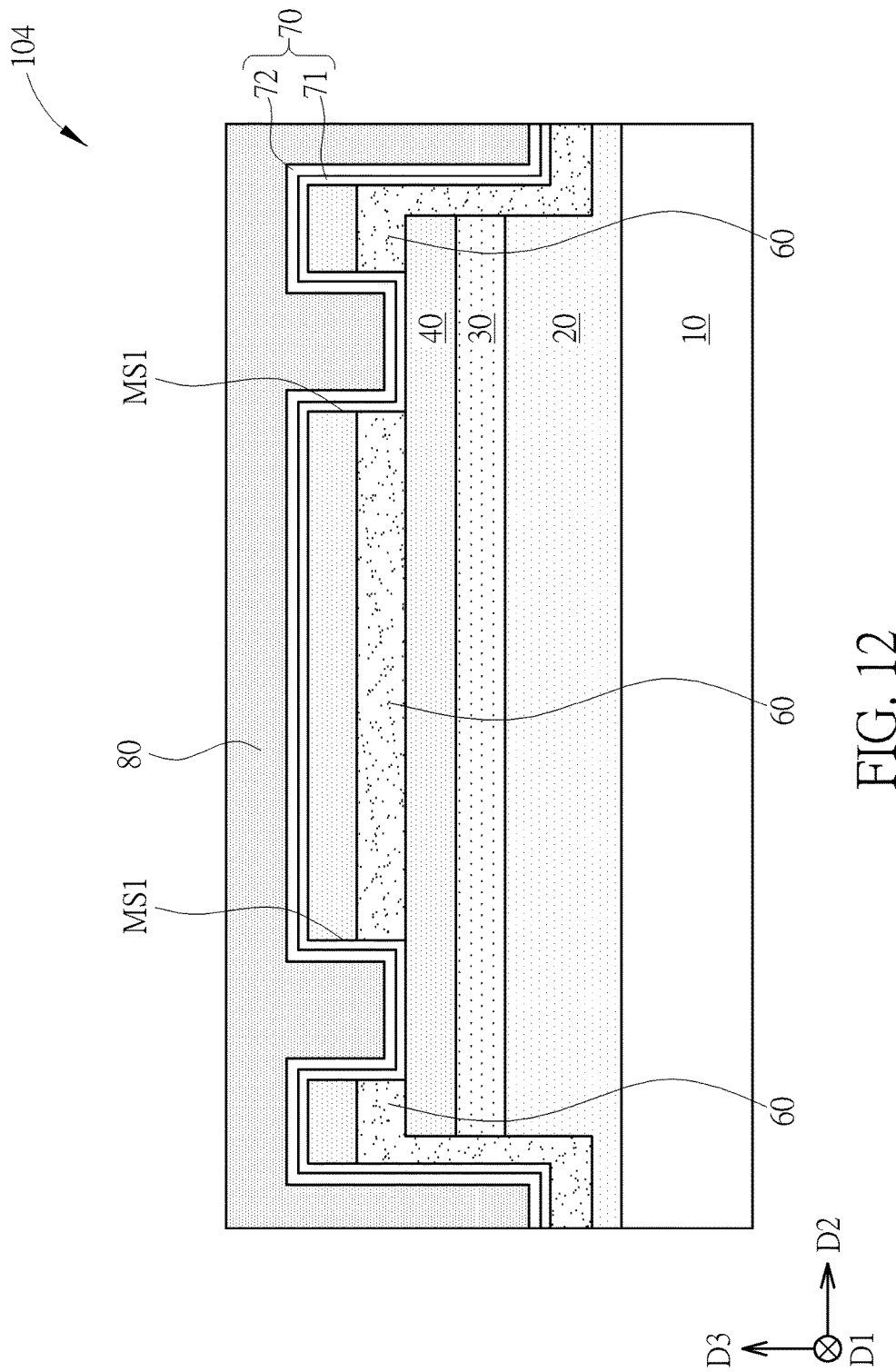
FIG. 12 is a cross-sectional diagram taken along a line A-A' in FIG. 11.

Please refer to FIG. 11 and FIG. 12. FIG. 11 is a top view schematic drawing illustrating an HEMT according to a fourth embodiment of the present invention, and FIG. 12 is a cross-sectional diagram taken along a line A-A' in FIG. 11. As shown in FIG. 11 and FIG. 12, the difference between an HEMT 104 in this embodiment and the HEMT in the third embodiment mentioned above is that the fluorine region 60 in this embodiment may further extend to cover the top surface of the buffer layer 20 and the side surfaces of the buffer layer 20, the first III-V compound layer 30, and the second III-V compound layer 40 for further enhancing the depleting effect on the channel region.

Figure 13:
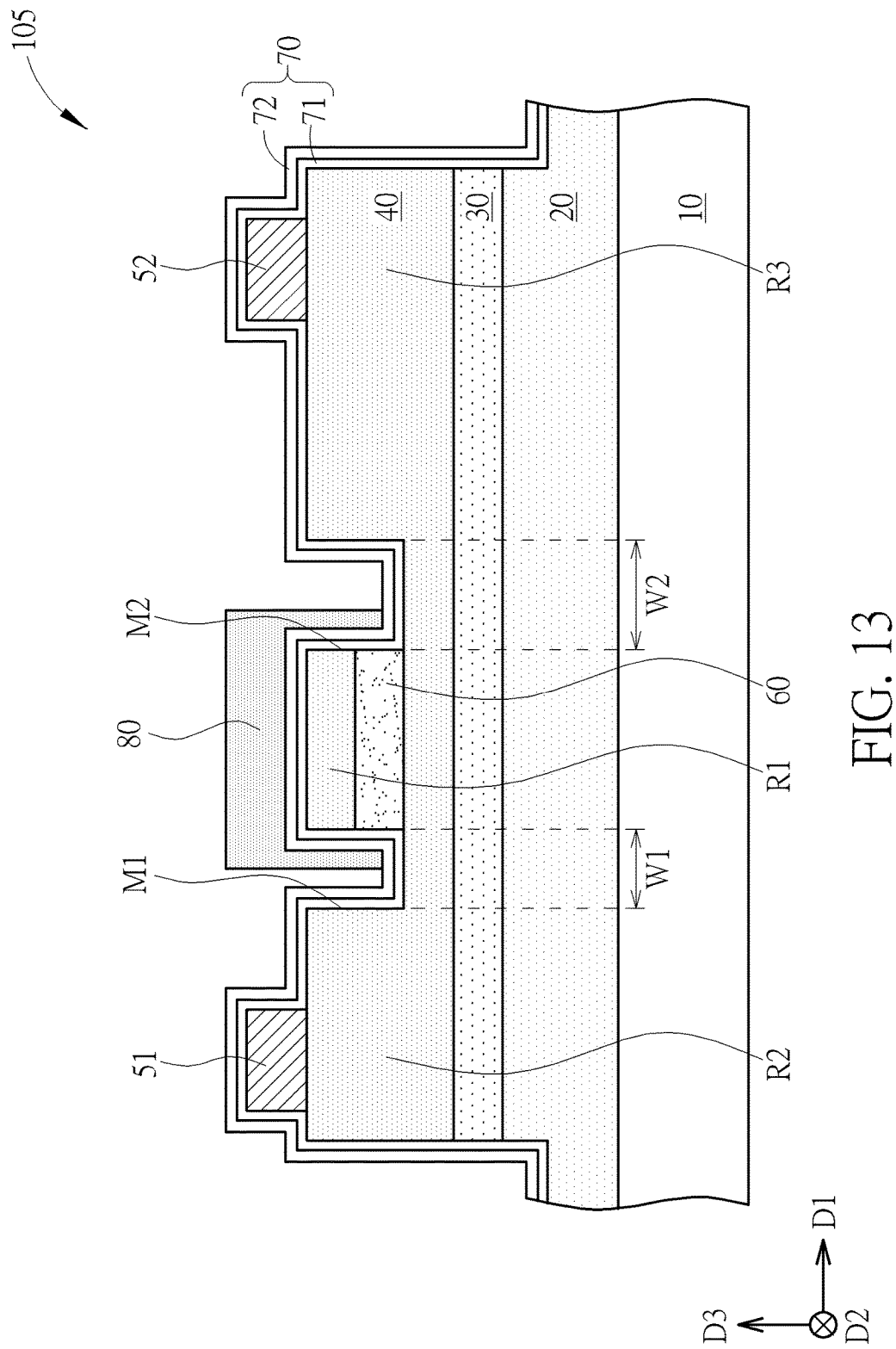
FIG. 13 is a schematic drawing illustrating an HEMT according to a fifth embodiment of the present invention.
Figure 14:
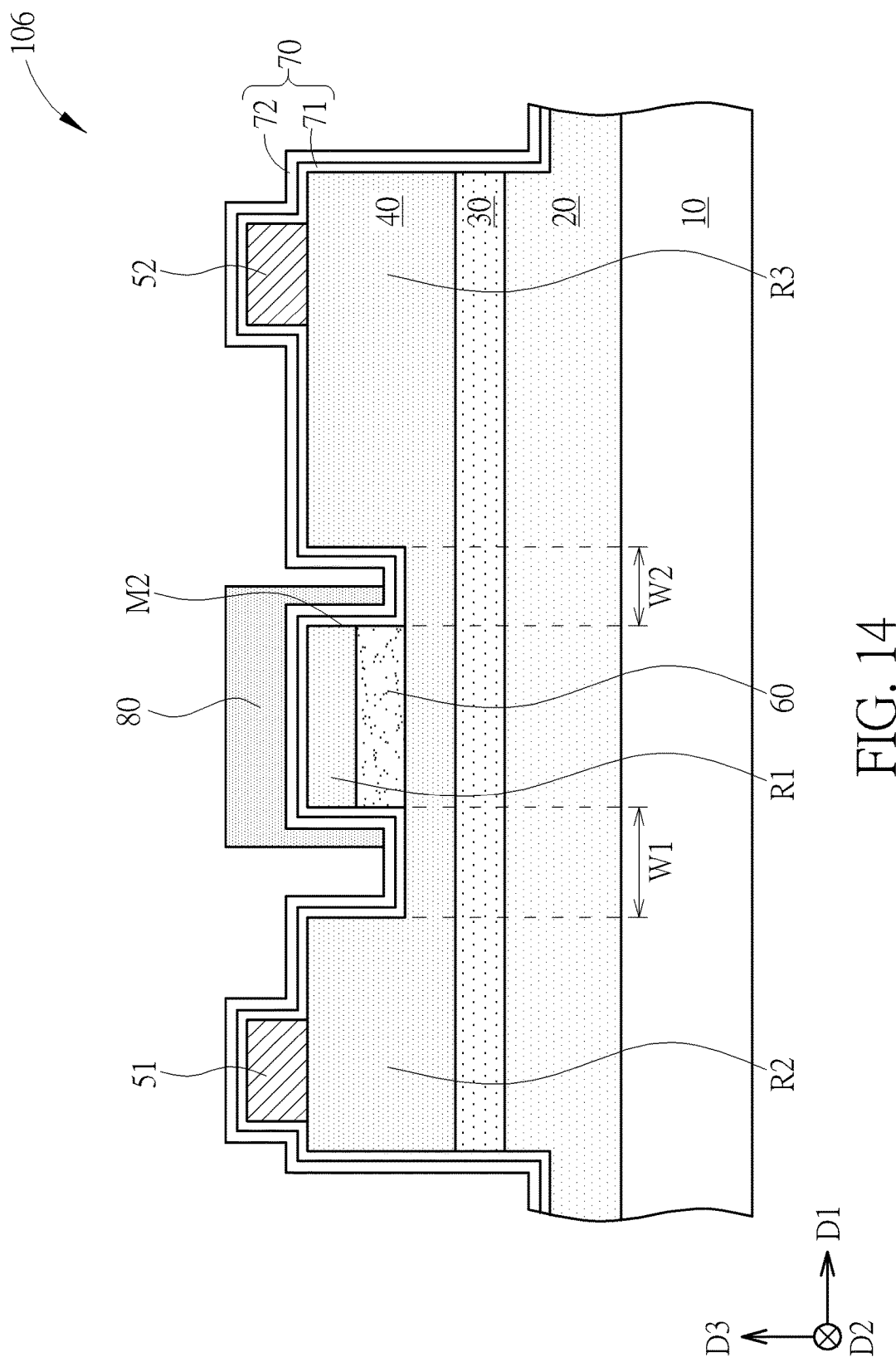
FIG. 14 is a schematic drawing illustrating an HEMT according to a sixth embodiment of the present invention.
Figure 15:
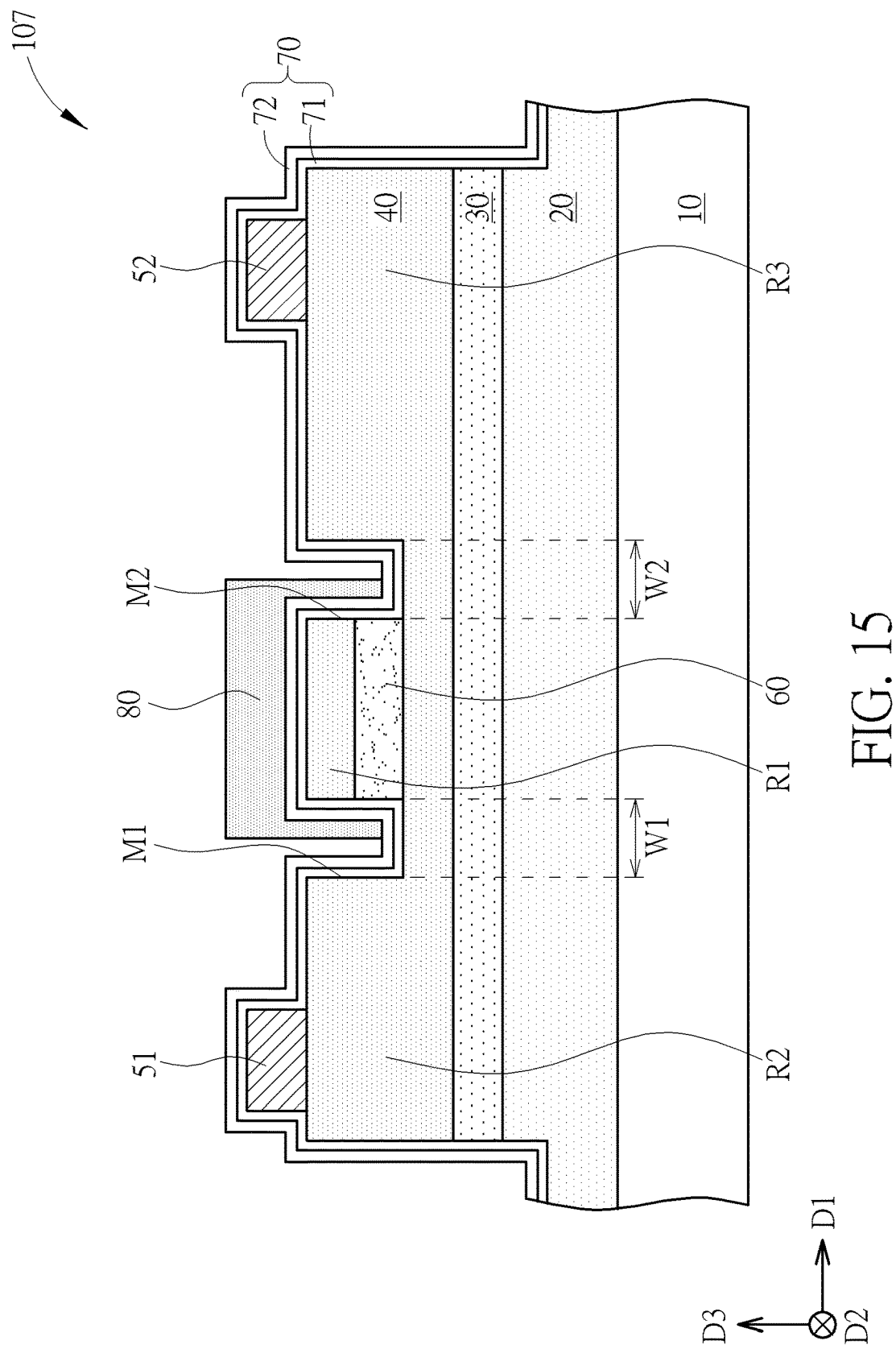
FIG. 15 is a schematic drawing illustrating an HEMT according to a seventh embodiment of the present invention.

Please refer to FIG. 13, FIG. 14, and FIG. 15. FIG. 13 is a schematic drawing illustrating an HEMT 105 according to a fifth embodiment of the present invention, FIG. 14 is a schematic drawing illustrating an HEMT 106 according to a sixth embodiment of the present invention, and FIG. 15 is a schematic drawing illustrating an HEMT 107 according to a seventh embodiment of the present invention. In the high electron mobility transistors of the present invention, the electric field distribution may be modified by controlling some design rules such as the dimension of the gate electrode and the relative relation of the distance between the gate electrode and the source electrode and the distance between the gate electrode and the drain electrode, and the breakdown voltage of the HEMT may be enhanced accordingly. For example, as shown in FIG. 13, the gate electrode 80 may be partially disposed in the first moat M1 and the second moat M2 without filling up the first moat M1 and the second moat M2 with the gate electrode 80 in some embodiments. In addition, the length of the first moat M1 in the first direction D1 (such as the first length W1 shown in FIG. 13) may be shorter than the length of the second moat M2 in the first direction D1 (such as the second length W2 shown in FIG. 13). The bigger second moat M2 may be used to mitigate the electric field distribution between the gate electrode 80 and the drain electrode 52 for keeping the negatively charged fluorine ions in the fluorine region 60 from migrating outward by the stronger electric field, but not limited thereto. As shown in FIG. 14, in some embodiments, the second length W2 of the second moat M2 in the first direction D1 may be shorter than the first length W1 of the first moat M1 in the first direction D1. As shown in FIG. 15, in some embodiments, the first length W1 of the first moat M1 in the first direction D1 may be substantially equal to the second length W2 of the second moat M2 in the first direction D1. It is worth noting that the relative length conditions described above between the first moat M1 and the second moat M2 may also be applied to other embodiments of the present invention.

Figure 16:
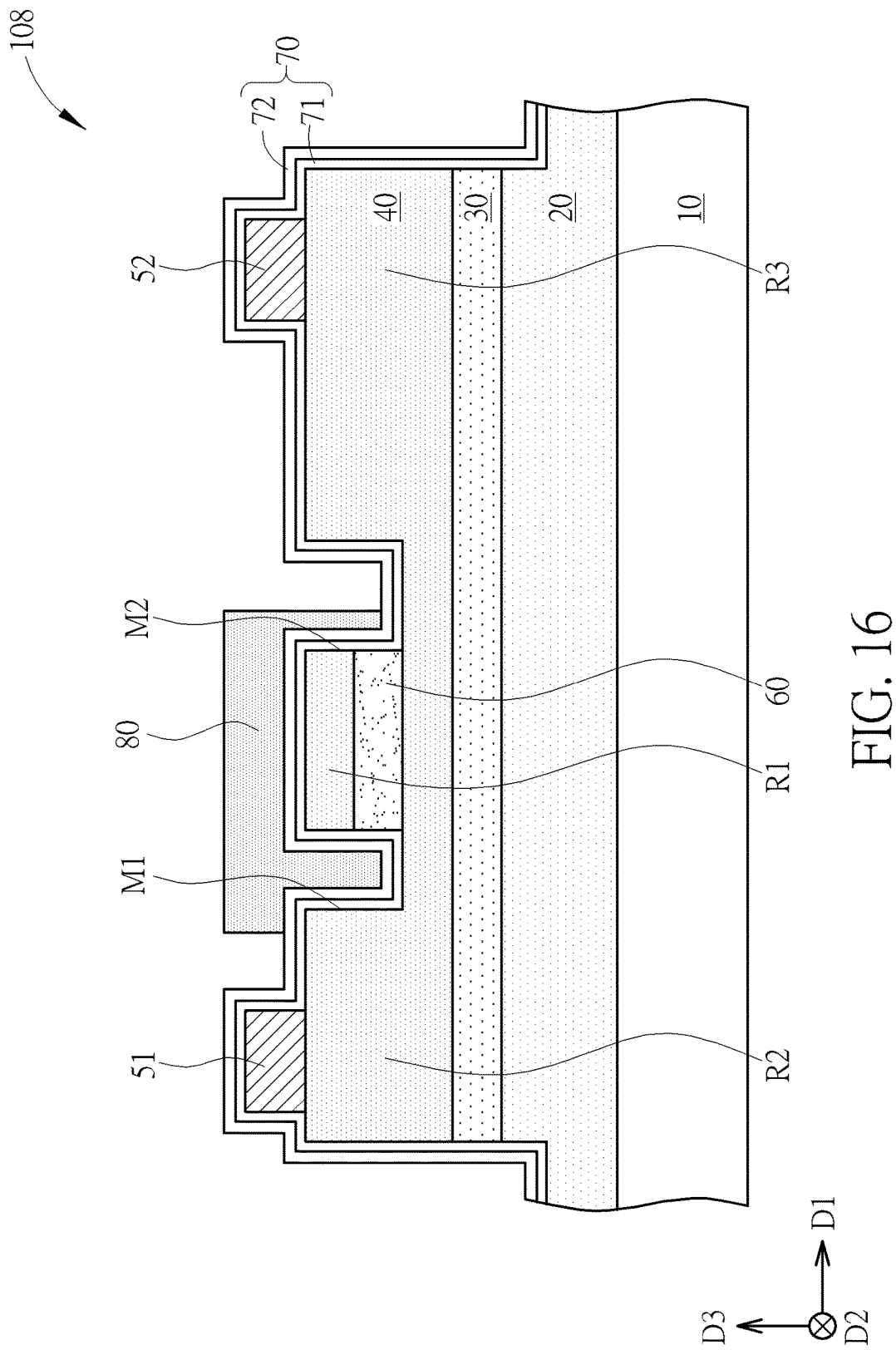
FIG. 16 is a schematic drawing illustrating an HEMT according to an eighth embodiment of the present invention.

Please refer to FIG. 16. FIG. 16 is a schematic drawing illustrating an HEMT according to an eighth embodiment of the present invention. As shown in FIG. 16, the difference between an HEMT 108 in this embodiment and the HEMT in the fifth embodiment mentioned above is that the gate electrode 80 in this embodiment may extend towards the source electrode 51 for overlapping a part of the second III-V compound layer 40 disposed between the first moat M1 and the source electrode 51 in the vertical direction D3. The first moat M1 may be filled up with the gate electrode 80 and the gate dielectric layer 70, and the second moat M2 is partially or not filled up with the gate electrode 80 and the gate dielectric layer 70.

Figure 17:
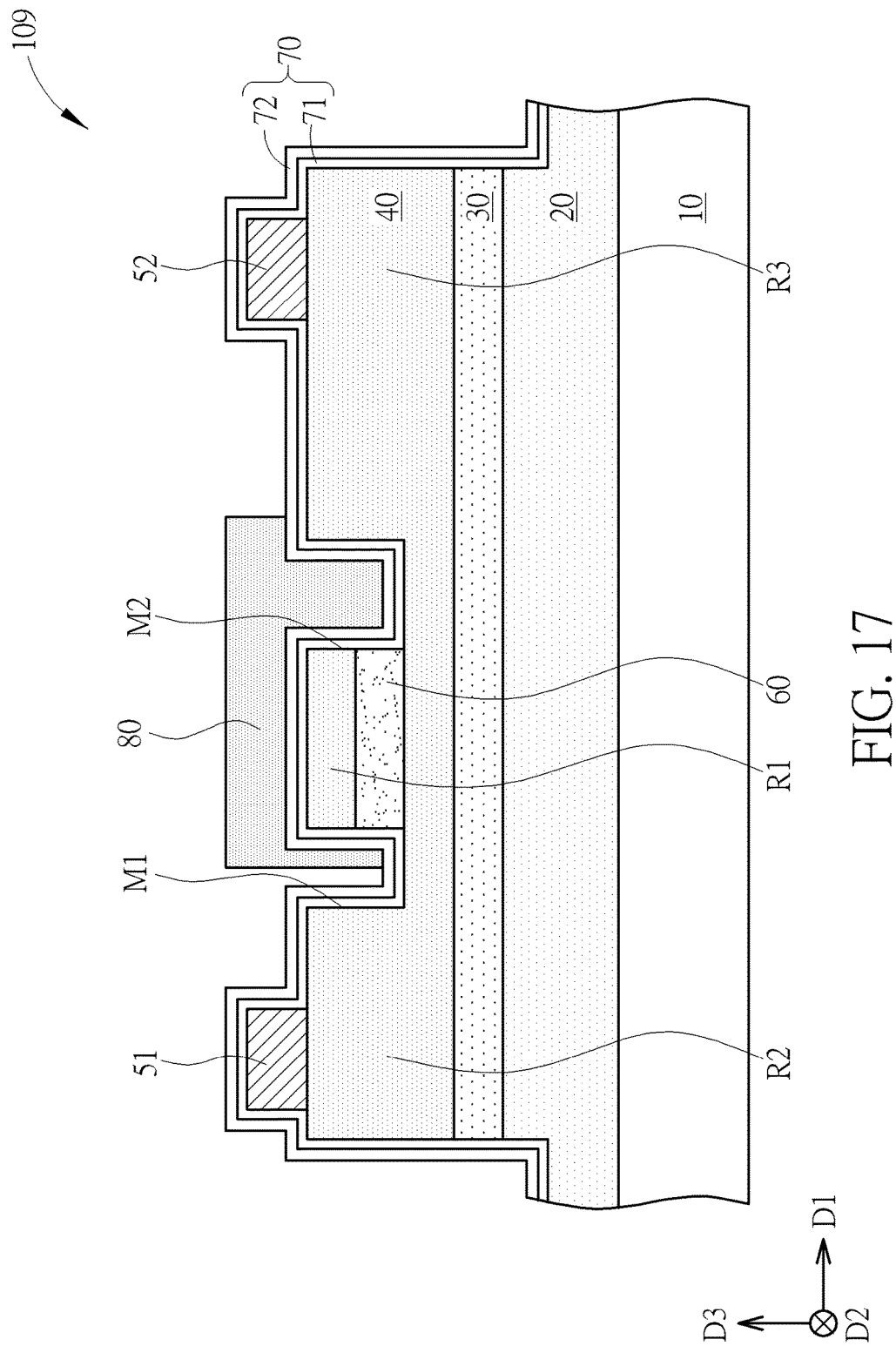
FIG. 17 is a schematic drawing illustrating an HEMT according to a ninth embodiment of the present invention.

Please refer to FIG. 17. FIG. 17 is a schematic drawing illustrating an HEMT according to a ninth embodiment of the present invention. As shown in FIG. 17, the difference between an HEMT 109 in this embodiment and the HEMT in the fifth embodiment mentioned above is that the gate electrode 80 in this embodiment may extend towards the drain electrode 52 for overlapping a part of the second III-V compound layer 40 disposed between the second moat M2 and the drain electrode 52 in the vertical direction D3. The second moat M2 may be filled up with the gate electrode 80 and the gate dielectric layer 70, and the first moat M1 is partially or not filled up with the gate electrode 80 and the gate dielectric layer 70.

Figure 18:
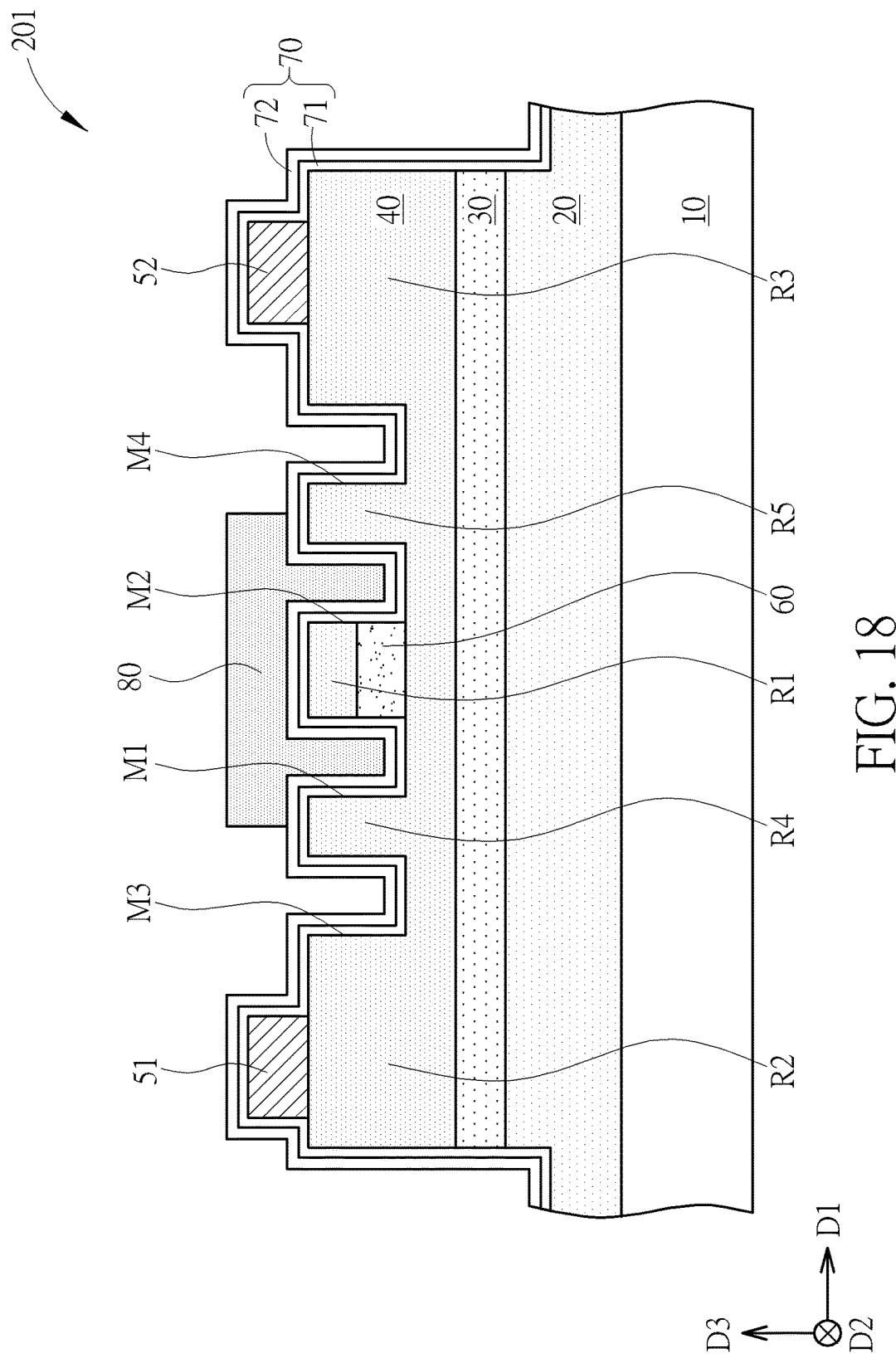
FIG. 18 is a schematic drawing illustrating an HEMT according to a tenth embodiment of the present invention.
Figure 19:
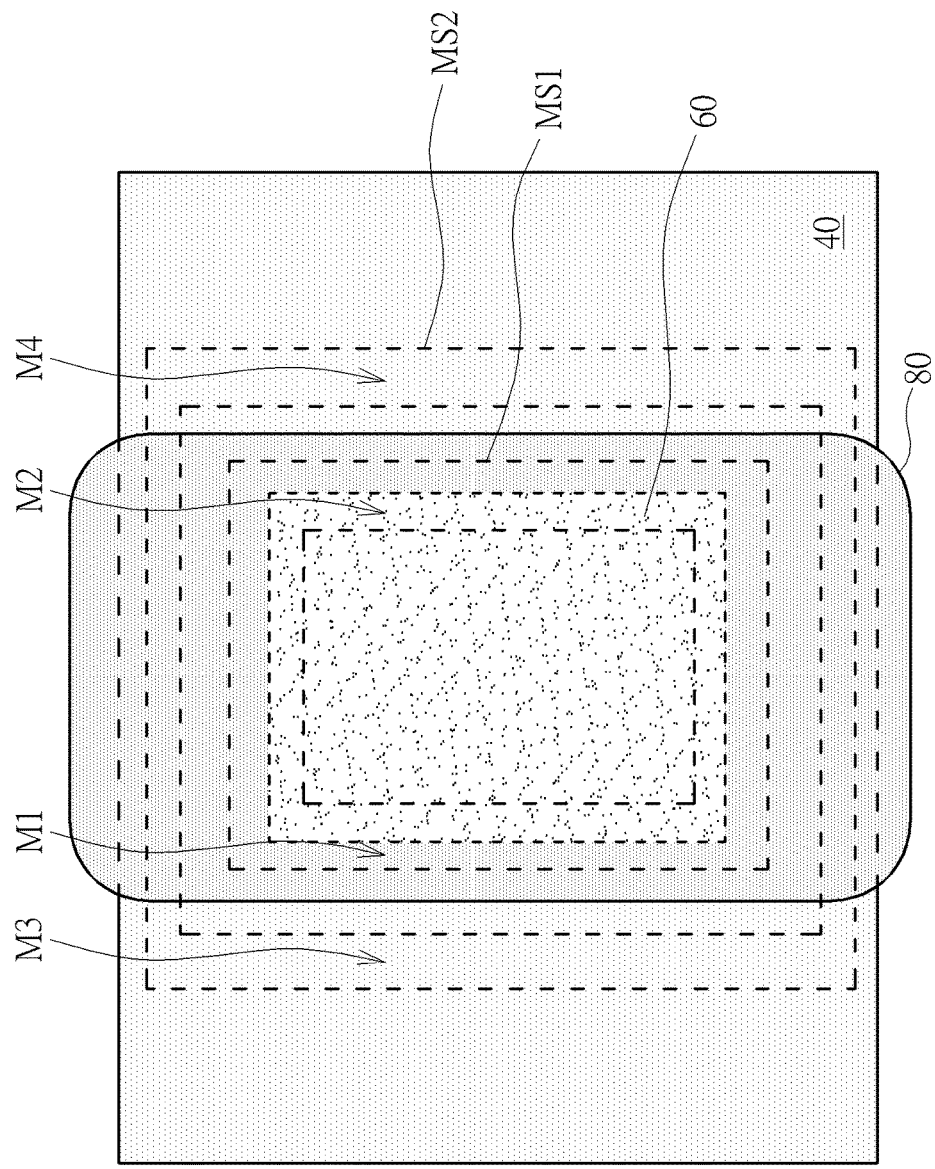
FIG. 19 is a top view schematic drawing illustrating an example of the HEMT according to the tenth embodiment of the present invention.
Figure 20:
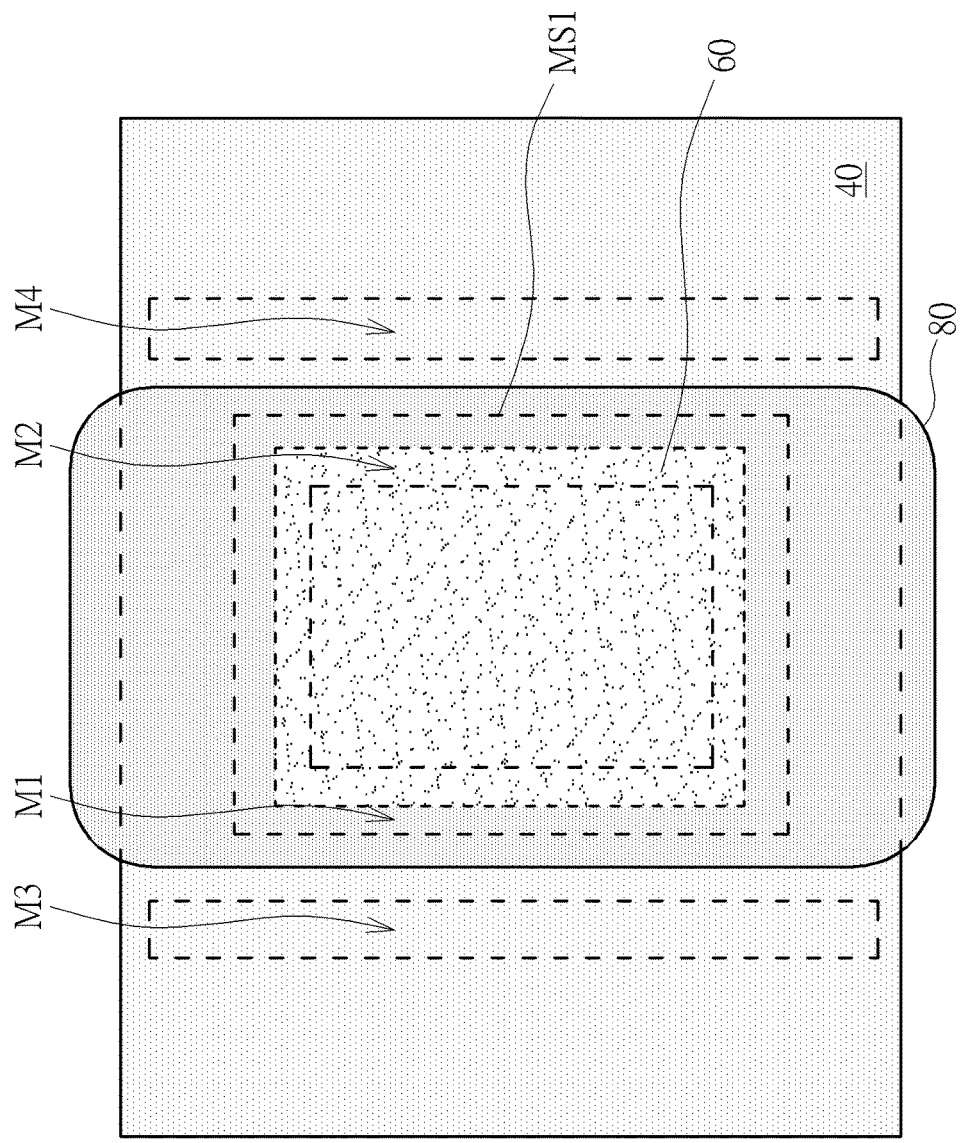
FIG. 20 is a top view schematic drawing illustrating another example of the HEMT according to the tenth embodiment of the present invention.

Please refer to FIG. 18. FIG. 18 is a schematic drawing illustrating an HEMT according to a tenth embodiment of the present invention. As shown in FIG. 18, the difference between an HEMT 201 in this embodiment and the HEMT in the second embodiment mentioned above is that the HEMT 201 may further include a third moat M3 and a fourth moat M4. The third moat M3 and the fourth moat M4 are at least partially disposed in the second III-V compound layer 40. The third moat M3 is at least partially disposed between the first moat M1 and the source electrode 51 in the first direction D1. The fourth moat M4 is at least partially disposed between the second moat M2 and the drain electrode 52 in the first direction D1. In other words, the second III-V compound layer 40 may further include a fourth region R4 and a fifth region R5, the fourth region R4 is located between the first moat M1 and the third moat M3, and the fifth region R5 is located between the second moat M2 and the fourth moat M4. Apart from the first moat M1 and the second moat M2, the third moat M3 and the fourth moat M4 may be used to form another blocking effect, and the migration of the fluorine region 69 may be further suppressed accordingly. Additionally, please refer to FIG. 19 and FIG. 20. FIG. 19 is a top view schematic drawing illustrating an example of the HEMT 201 in this embodiment, and FIG. 20 is a top view schematic drawing illustrating another example of the HEMT 201 in this embodiment. As shown in FIG. 18 and FIG. 19, in some examples, the third moat M3 and the fourth moat M4 may be connected to each other and form a second moat structure MS2, and the second moat structure MS2 may surround the first region R1 of the second III-V compound layer 40 and the first moat structure MS1 composed of the first moat M1 and the second moat M2 in the first direction D1 and the second direction D2. The effect of suppressing the migration of the fluorine region 60 may be further enhanced by the second moat structure MS2, and the reliability of the HEMT 201 may be further improved accordingly. As shown in FIG. 18 and FIG. 20, in some examples, the third moat M3 and the fourth moat M4 may be separated from each other. For instance, the third moat M3 and the fourth moat M4 may respectively be a stripe moat extending in the second direction D2, and the first moat structure MS1 may be disposed between the third moat M3 and the fourth moat M4 in the first direction D1.

Figure 21:
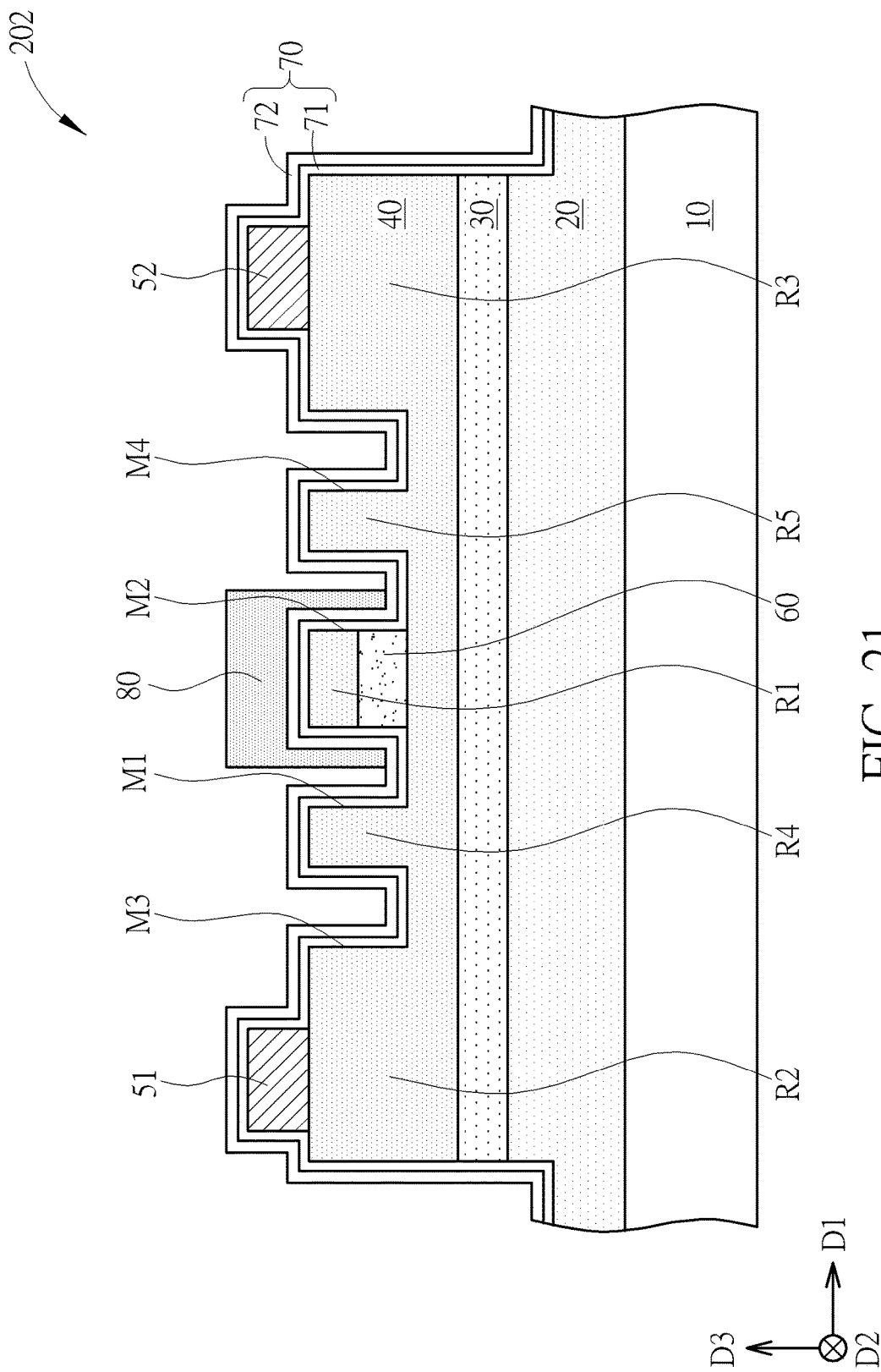
FIG. 21 is a schematic drawing illustrating an HEMT according to an eleventh embodiment of the present invention.
Figure 22:
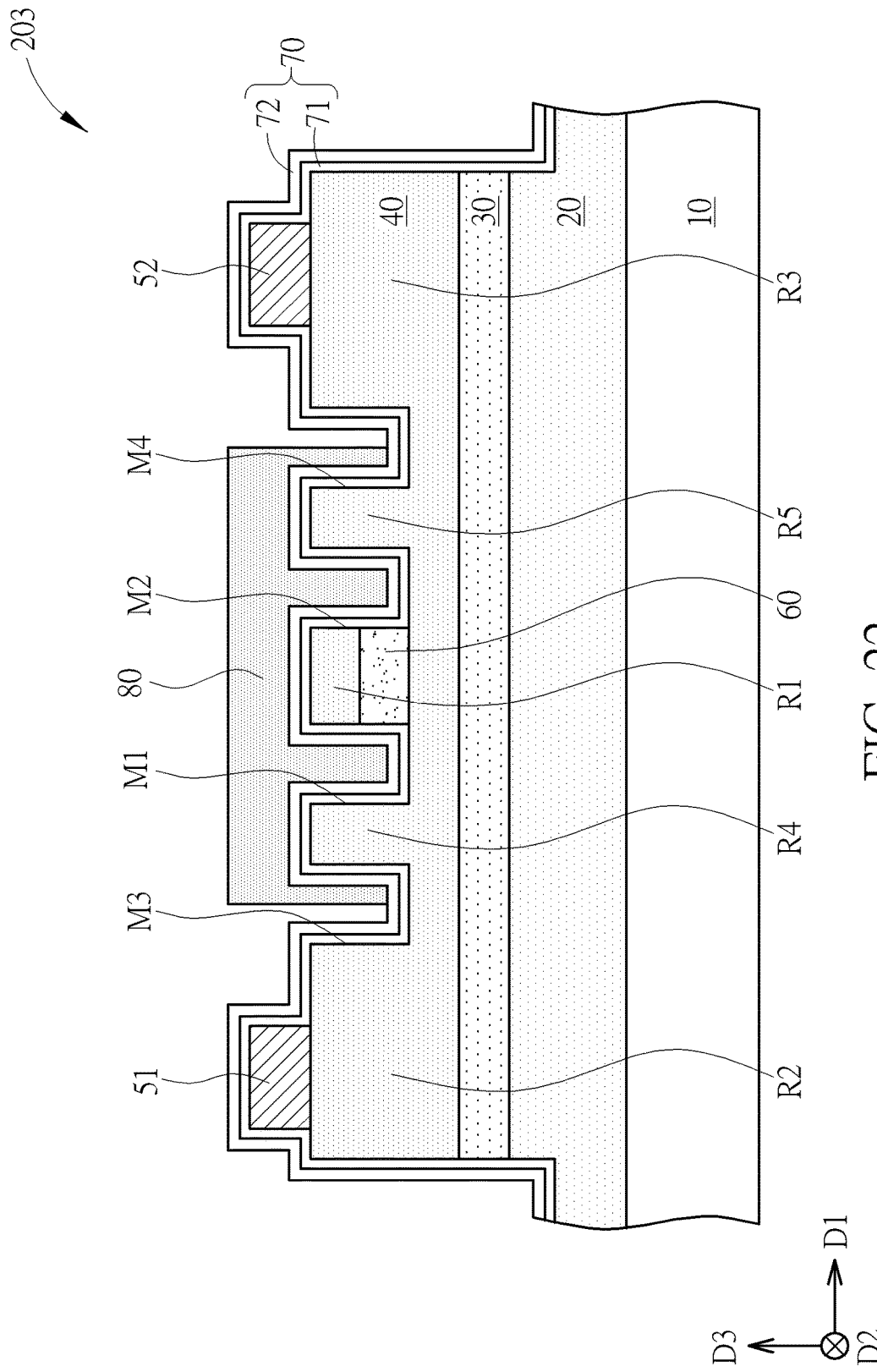
FIG. 22 is a schematic drawing illustrating an HEMT according to a twelfth embodiment of the present invention.
Figure 23:
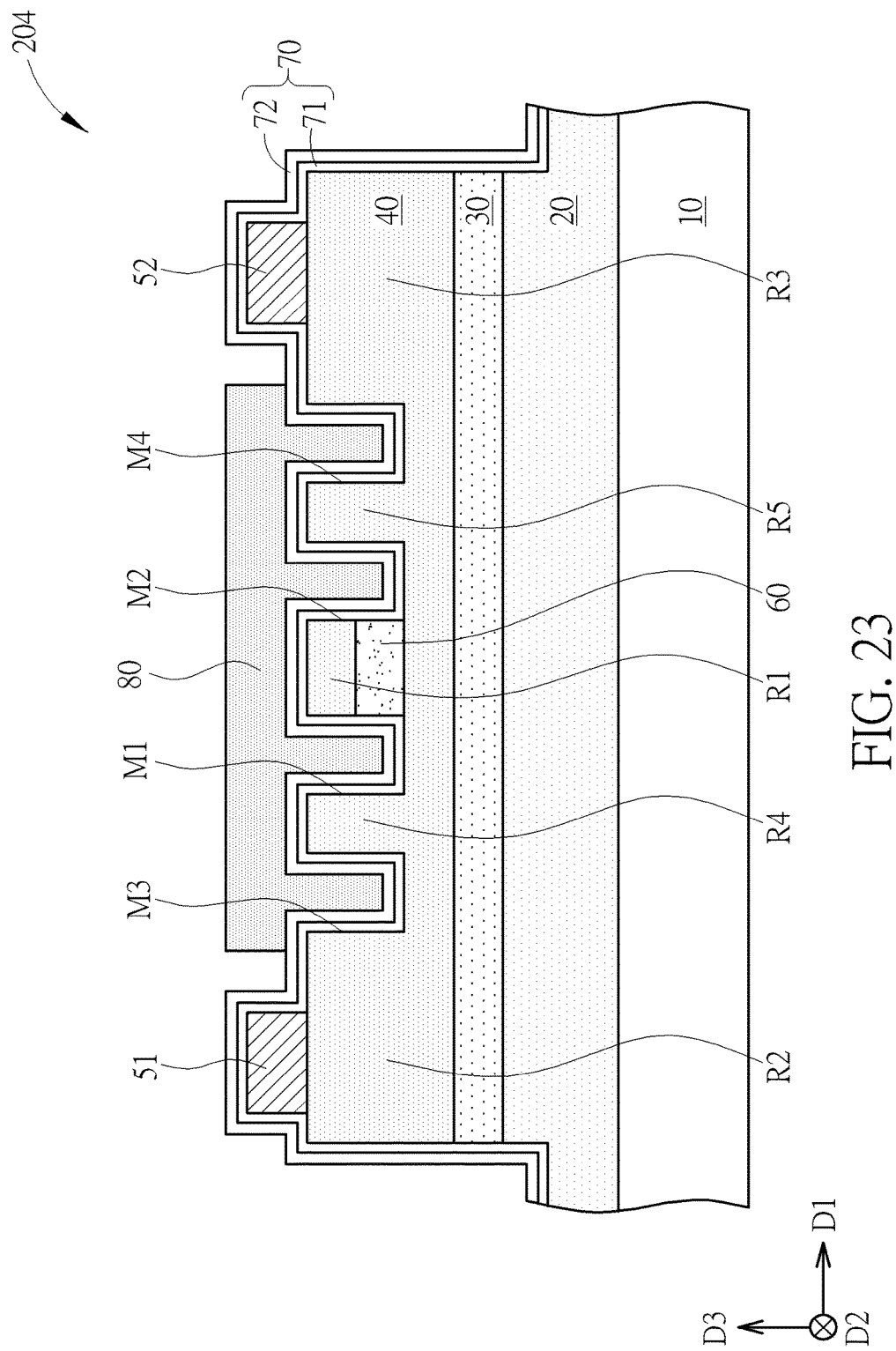
FIG. 23 is a schematic drawing illustrating an HEMT according to a thirteenth embodiment of the present invention.
Figure 24:
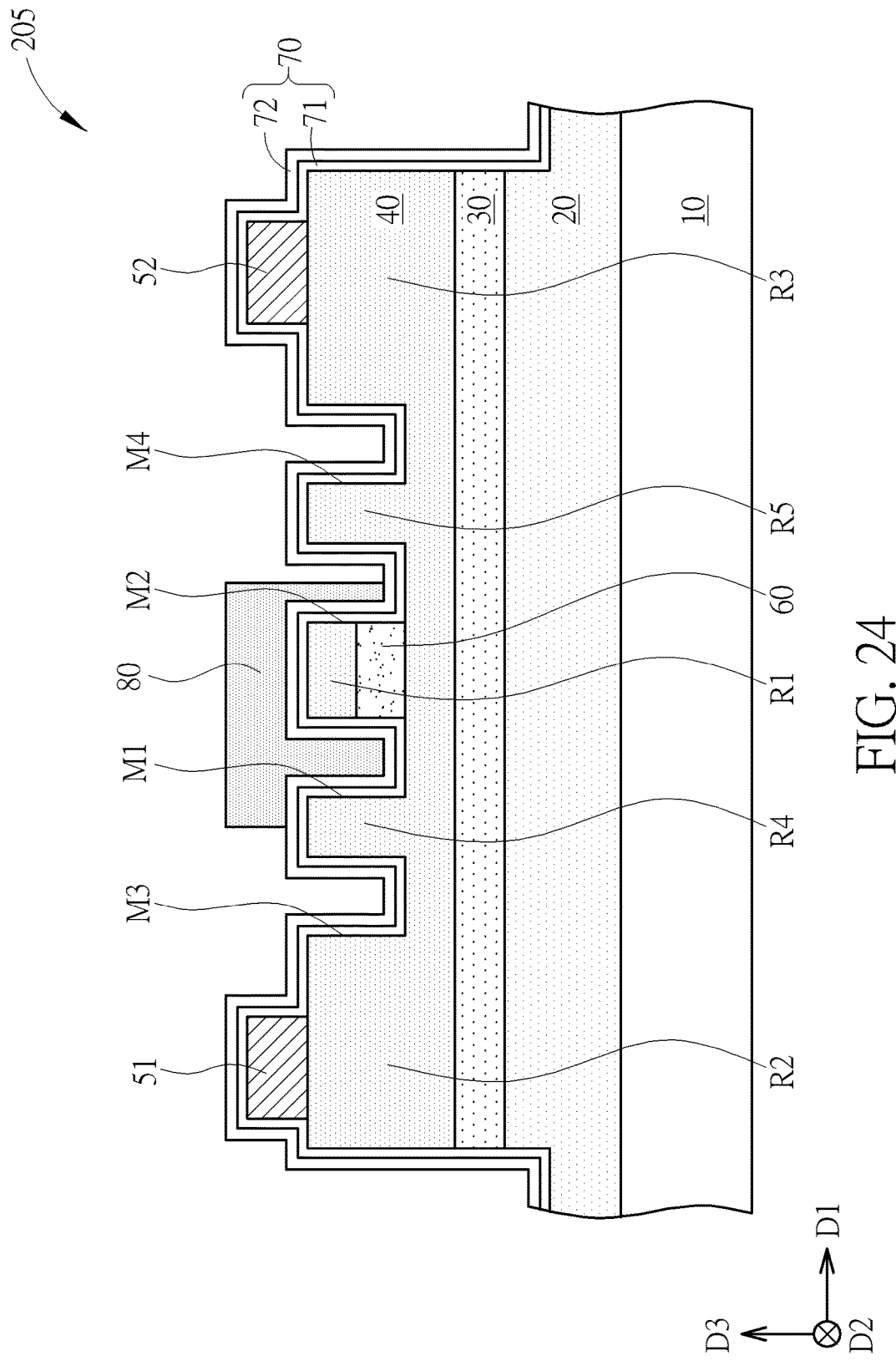
FIG. 24 is a schematic drawing illustrating an HEMT according to a fourteenth embodiment of the present invention.
Figure 25:
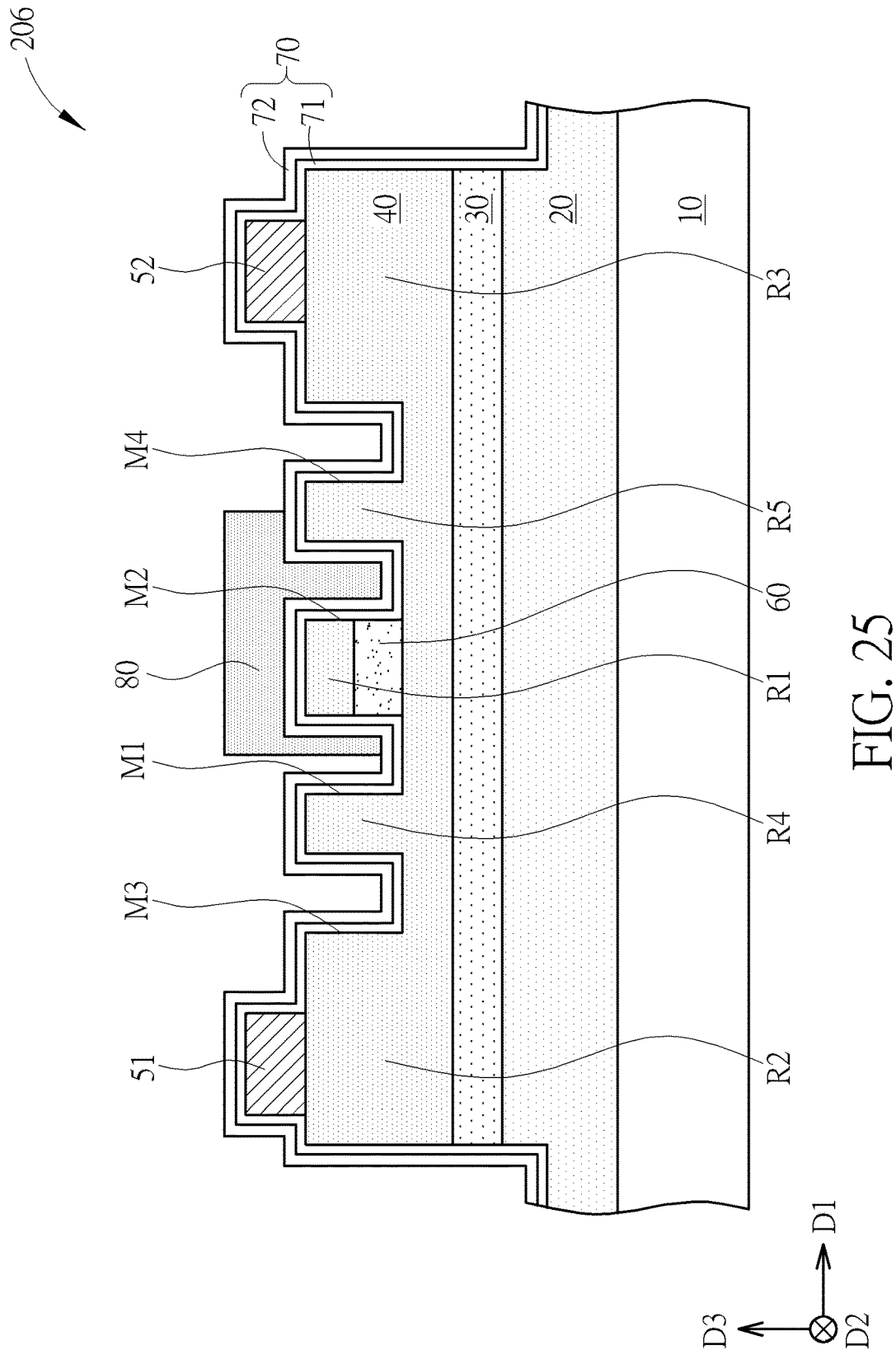
FIG. 25 is a schematic drawing illustrating an HEMT according to a fifteenth embodiment of the present invention.
Figure 26:
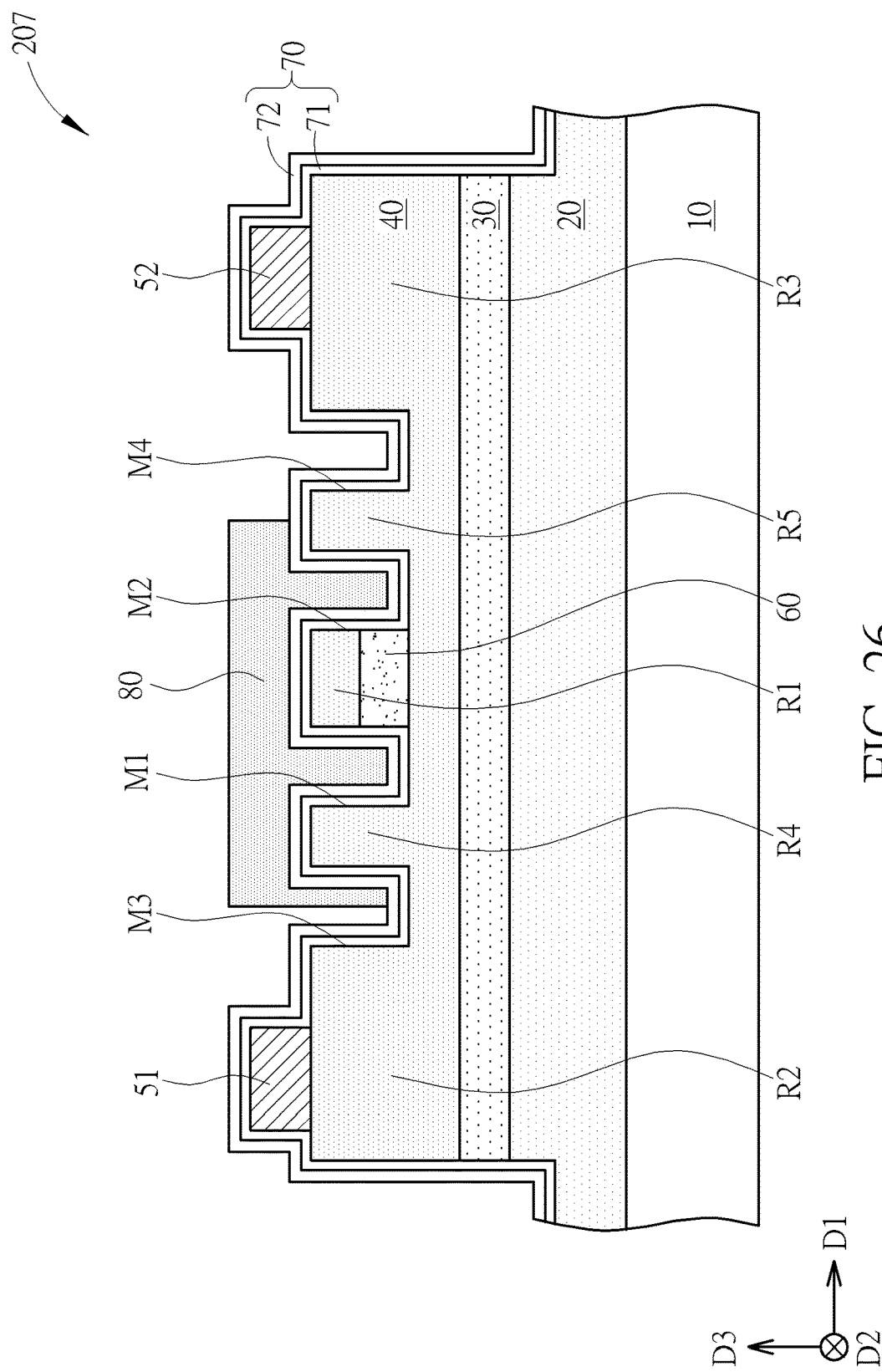
FIG. 26 is a schematic drawing illustrating an HEMT according to a sixteenth embodiment of the present invention.
Figure 27:
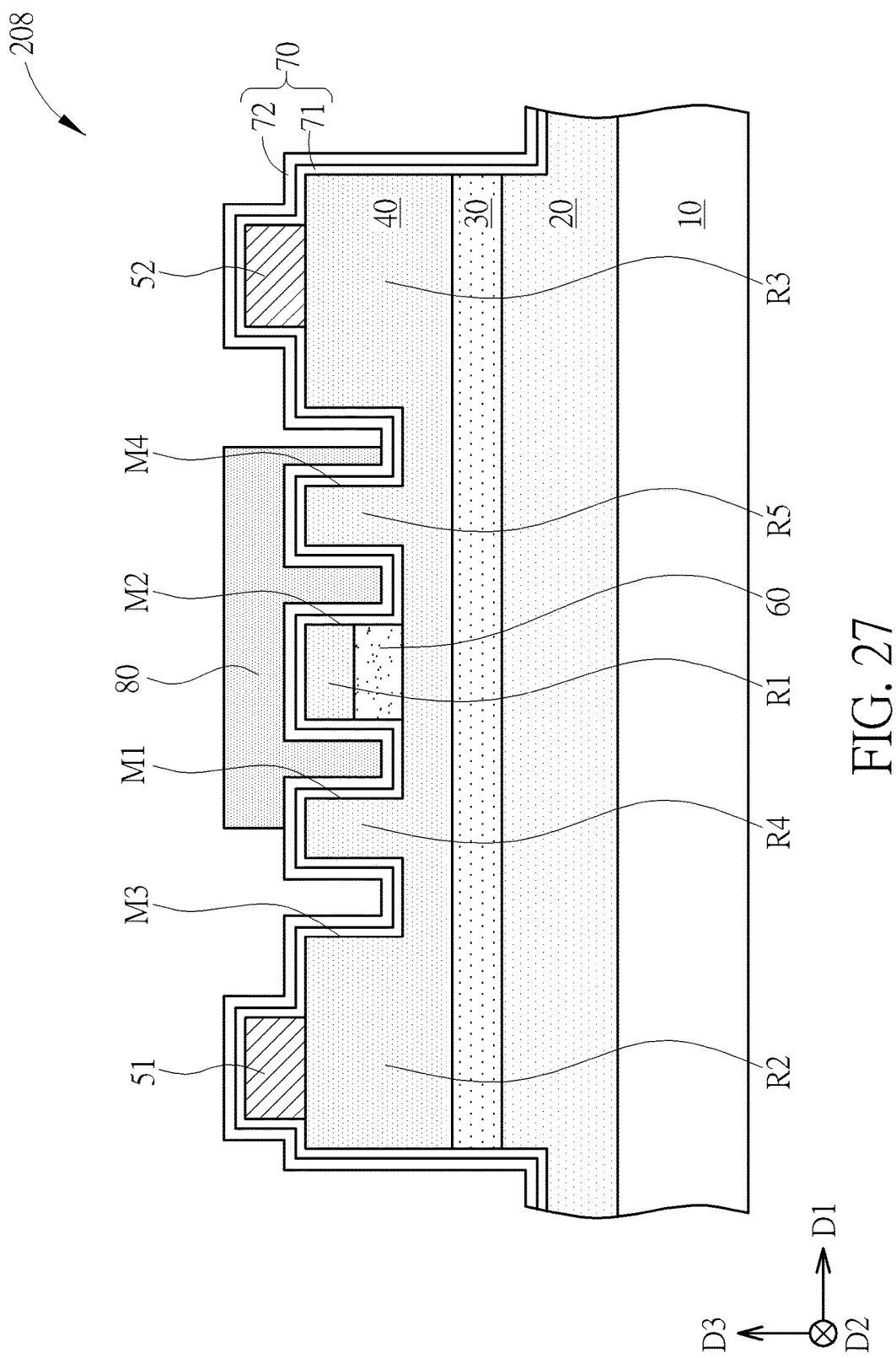
FIG. 27 is a schematic drawing illustrating an HEMT according to a seventeenth embodiment of the present invention.
Figure 28:
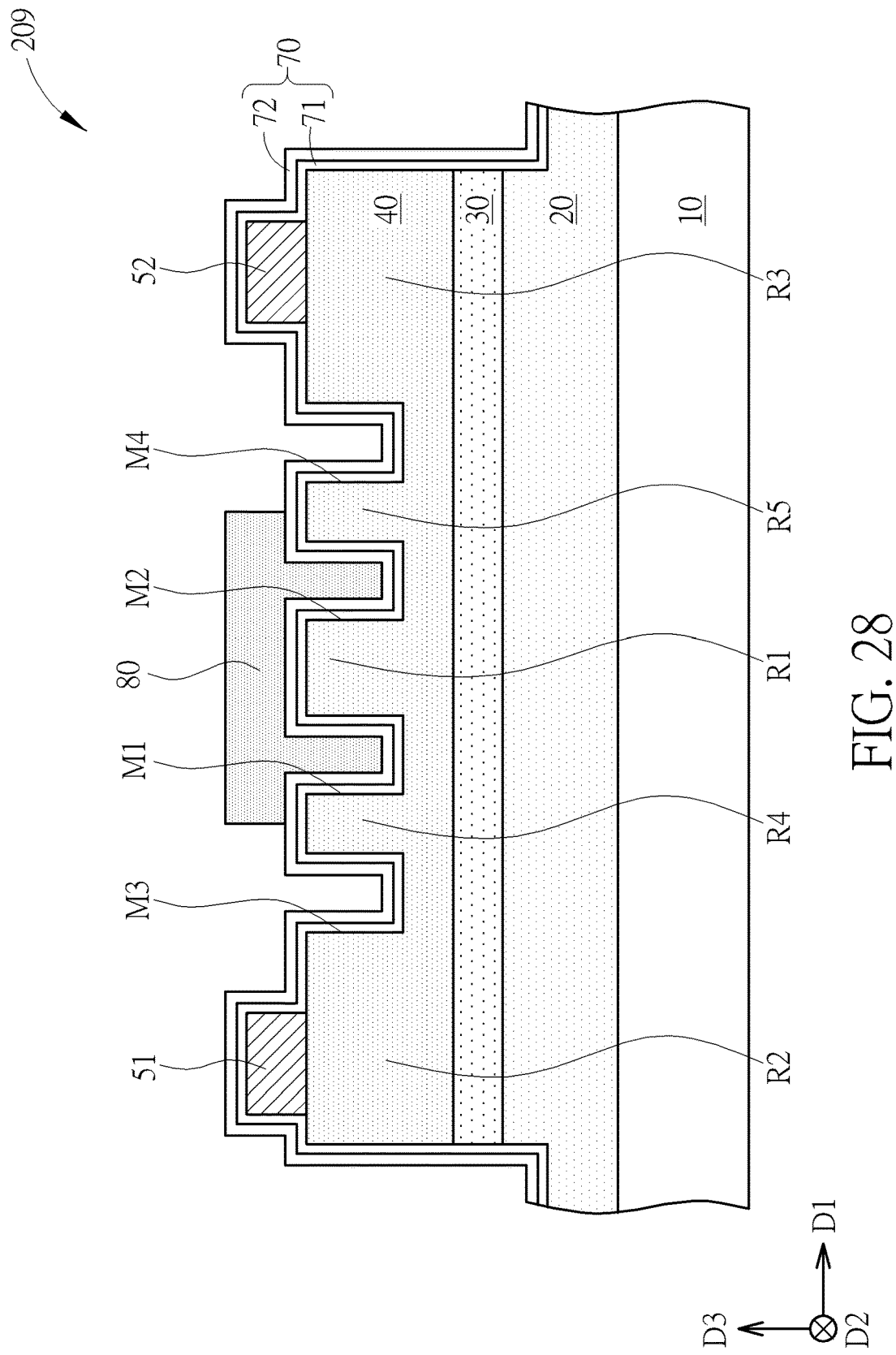
FIG. 28 is a schematic drawing illustrating an HEMT according to an eighteenth embodiment of the present invention.

Please refer to FIGS. 21-28. FIG. 21 is a schematic drawing illustrating an HEMT 202 according to an eleventh embodiment of the present invention, FIG. 22 is a schematic drawing illustrating an HEMT 203 according to a twelfth embodiment of the present invention, FIG. 23 is a schematic drawing illustrating an HEMT 204 according to a thirteenth embodiment of the present invention, FIG. 24 is a schematic drawing illustrating an HEMT 205 according to a fourteenth embodiment of the present invention, FIG. 25 is a schematic drawing illustrating an HEMT 206 according to a fifteenth embodiment of the present invention, FIG. 26 is a schematic drawing illustrating an HEMT 207 according to a sixteenth embodiment of the present invention, FIG. 27 is a schematic drawing illustrating an HEMT 208 according to a seventeenth embodiment of the present invention, and FIG. 28 is a schematic drawing illustrating an HEMT 209 according to an eighteenth embodiment of the present invention. As shown in FIGS. 21-28, in some embodiments, the electric field distribution may be modified by controlling some design rules such as the dimension of the gate electrode 80 and the relative relation of the distance between the gate electrode 80 and the source electrode 51 and the distance between the gate electrode 80 and the drain electrode 52, and the breakdown voltage of the HEMT may be enhanced accordingly. For example, as shown in FIG. 21, in some embodiments, when the HEMT 202 includes the first moat M1, the second moat M2, the third moat M3, and the fourth moat M4, the gate electrode 80 may be partially disposed in the first moat M1 and the second moat M2 without being disposed in the third moat M3 and the fourth moat M4, and the first moat M1 and the second moat M2 may not be filled up with the gate electrode 80 and the gate dielectric layer 70. As shown in FIG. 22, in some embodiments, the gate electrode 80 may extend towards the source electrode 51 for being partially disposed in the first moat M1 and the third moat M3, and the gate electrode 80 may overlap the fourth region R4 of the second III-V compound layer 40, which is disposed between the third moat M3 and the first moat M1, in the vertical direction D3. Additionally, the gate electrode 80 may extend towards the drain electrode 52 for being partially disposed in the second moat M2 and the fourth moat M4, and the gate electrode 80 may overlap the fifth region R5 of the second III-V compound layer 40, which is disposed between the fourth moat M4 and the second moat M2, in the vertical direction D3. As shown in FIG. 22, the first moat M1 and the second moat M2 may be filled up with the gate electrode 80 and the gate dielectric layer 70, and the third moat M3 and the fourth moat M4 may not be fully filled up with the gate electrode 80 and the gate dielectric layer 70. As shown in FIG. 23, the third moat M3 and the fourth moat M4 may be filled with the gate electrode 80 and the gate dielectric layer 70. The gate electrode 80 may overlap a part of the second III-V compound layer 40 disposed between the third moat M3 and the source electrode 51, and the gate electrode 80 may overlap a part of the second III-V compound layer 40 disposed between the fourth moat M4 and the drain electrode 52. As shown in FIGS. 24-28, the gate electrode 80 may be disposed adjacent to the source electrode 51 or the drain electrode 52, and the first moat M1, the second moat M2, the third moat M3, and the fourth moat M4 may be filled up with the gate electrode 80 and the gate dielectric layer 70 respectively or not. It is worth noting that the fluorine region 60 may not be disposed in the embodiments of FIGS. 21-28 described above, and the purposes of controlling and/or altering the 2DEG and the electric field distribution may be achieved by the allocation of the third moat M3, the fourth moat M4, and the gate electrode 80.

Figure 29:
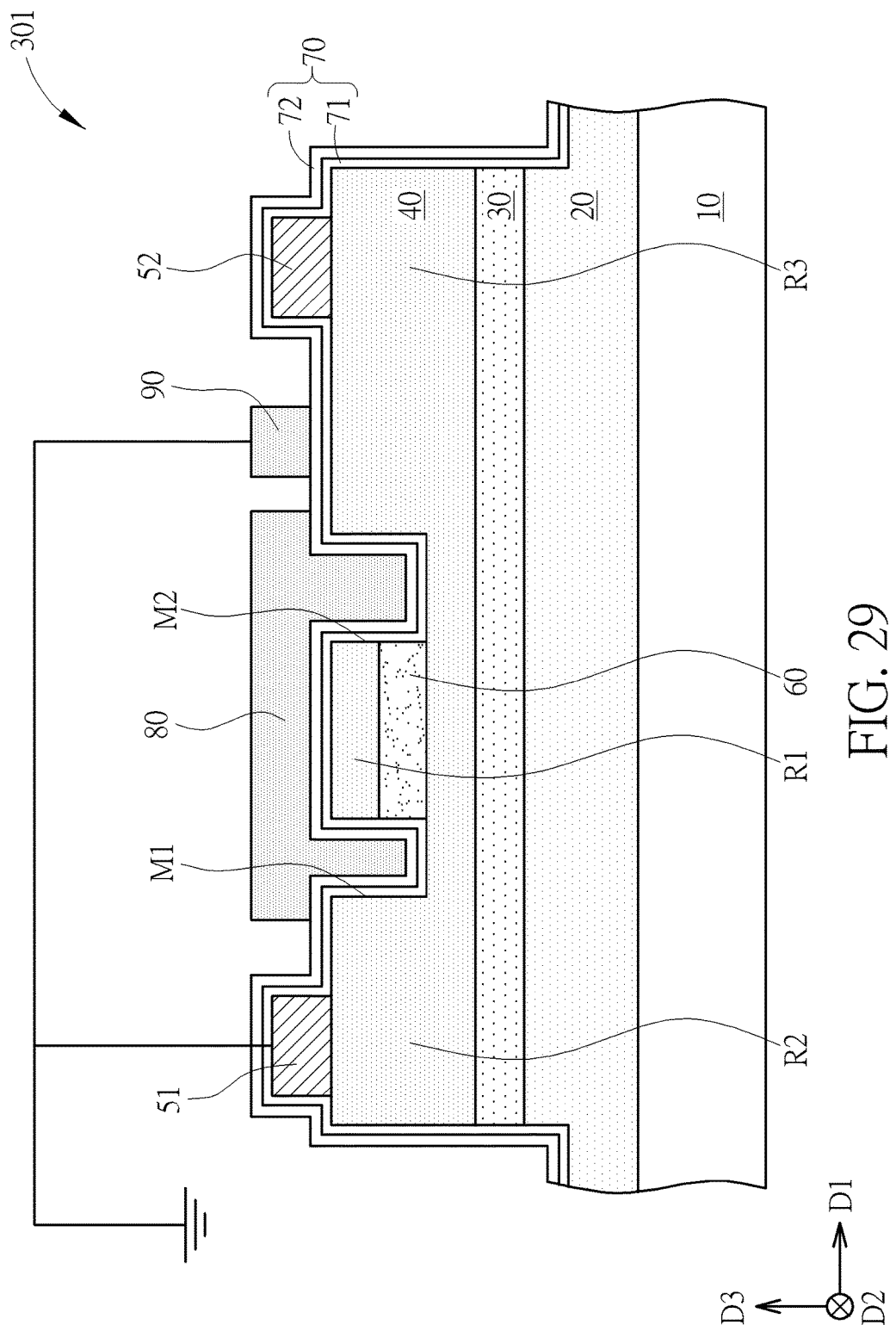
FIG. 29 is a schematic drawing illustrating an HEMT according to a nineteenth embodiment of the present invention.

Please refer to FIG. 29. FIG. 29 is a schematic drawing illustrating an HEMT according to a nineteenth embodiment of the present invention. As shown in FIG. 29, the difference between an HEMT 301 in this embodiment and the HEMT in the second embodiment mentioned above is that the HEMT 301 may further include an auxiliary electrode 90 disposed on a part of the second III-V compound layer 40 disposed between the second moat M2 and the drain electrode 52, and the auxiliary electrode 90 may be electrically connected with the source electrode 51. The auxiliary electrode 90 may be used to modify the carrier concentration between the second moat M2 and the drain electrode 52, and the HEMT 301 may be used in a cascade circuit device accordingly.

Figure 30:
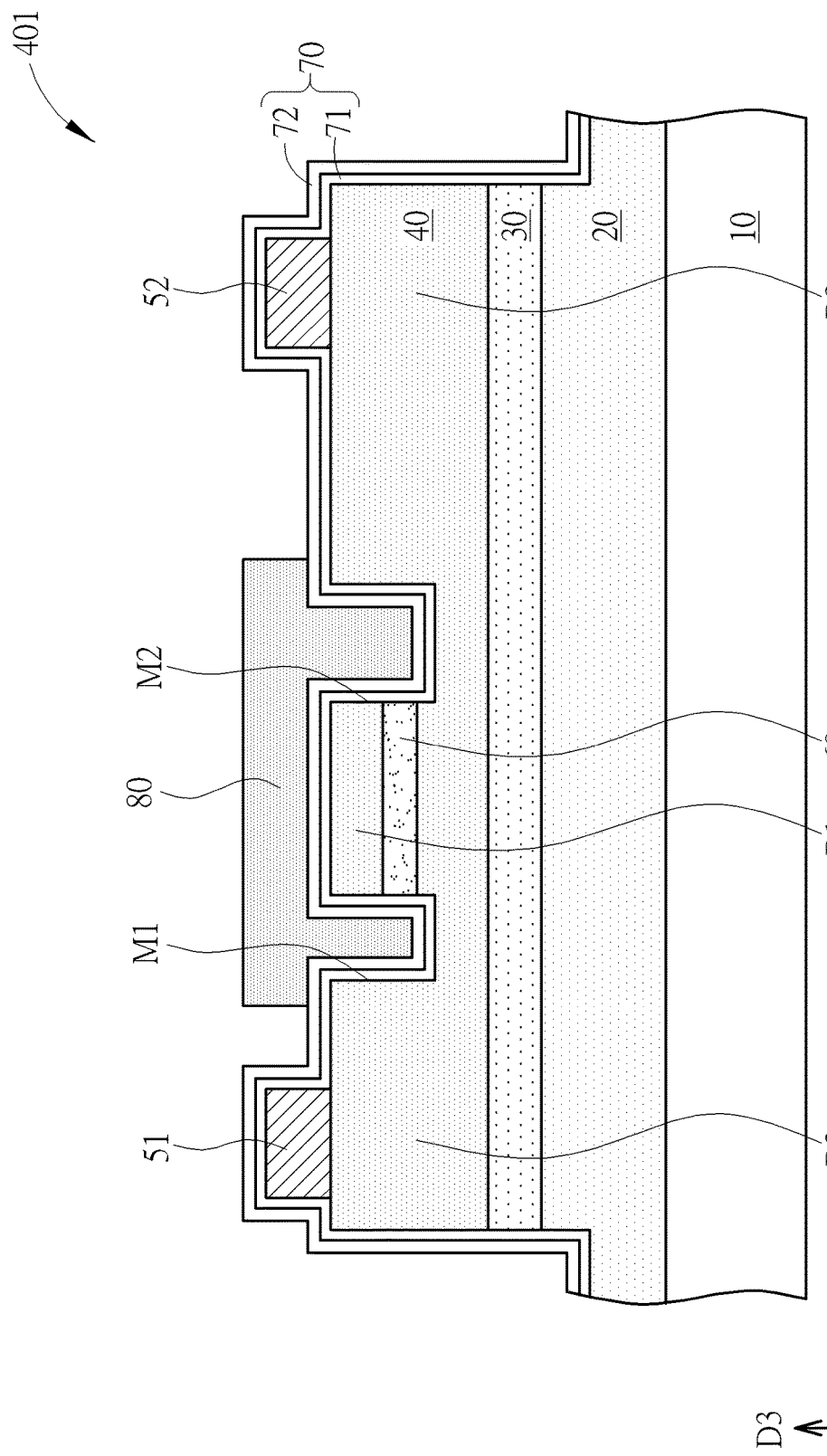
FIG. 30 is a schematic drawing illustrating an HEMT according to a twentieth embodiment of the present invention.
Figure 31:
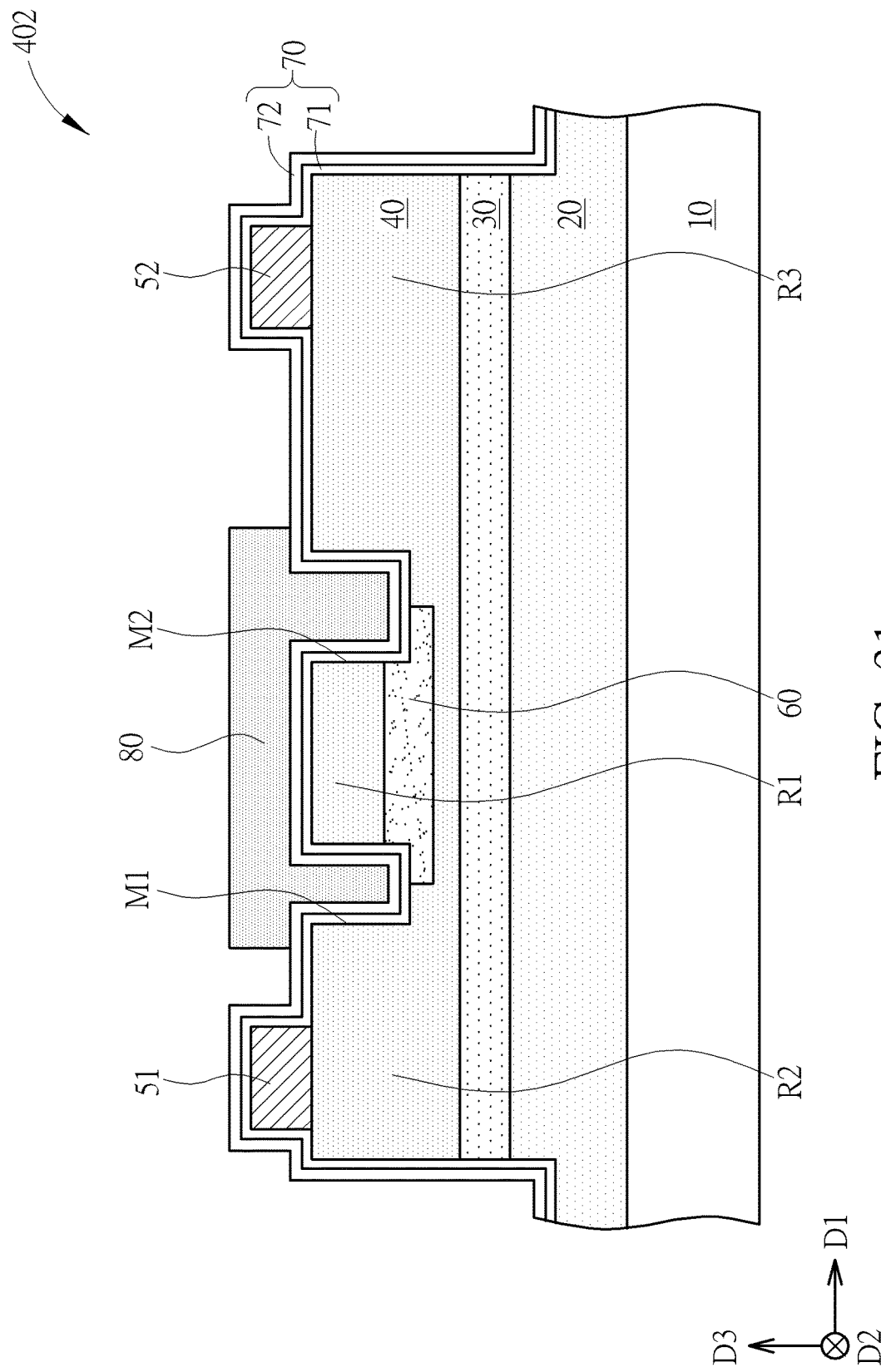
FIG. 31 is a schematic drawing illustrating an HEMT according to a twenty-first embodiment of the present invention.
Figure 32:
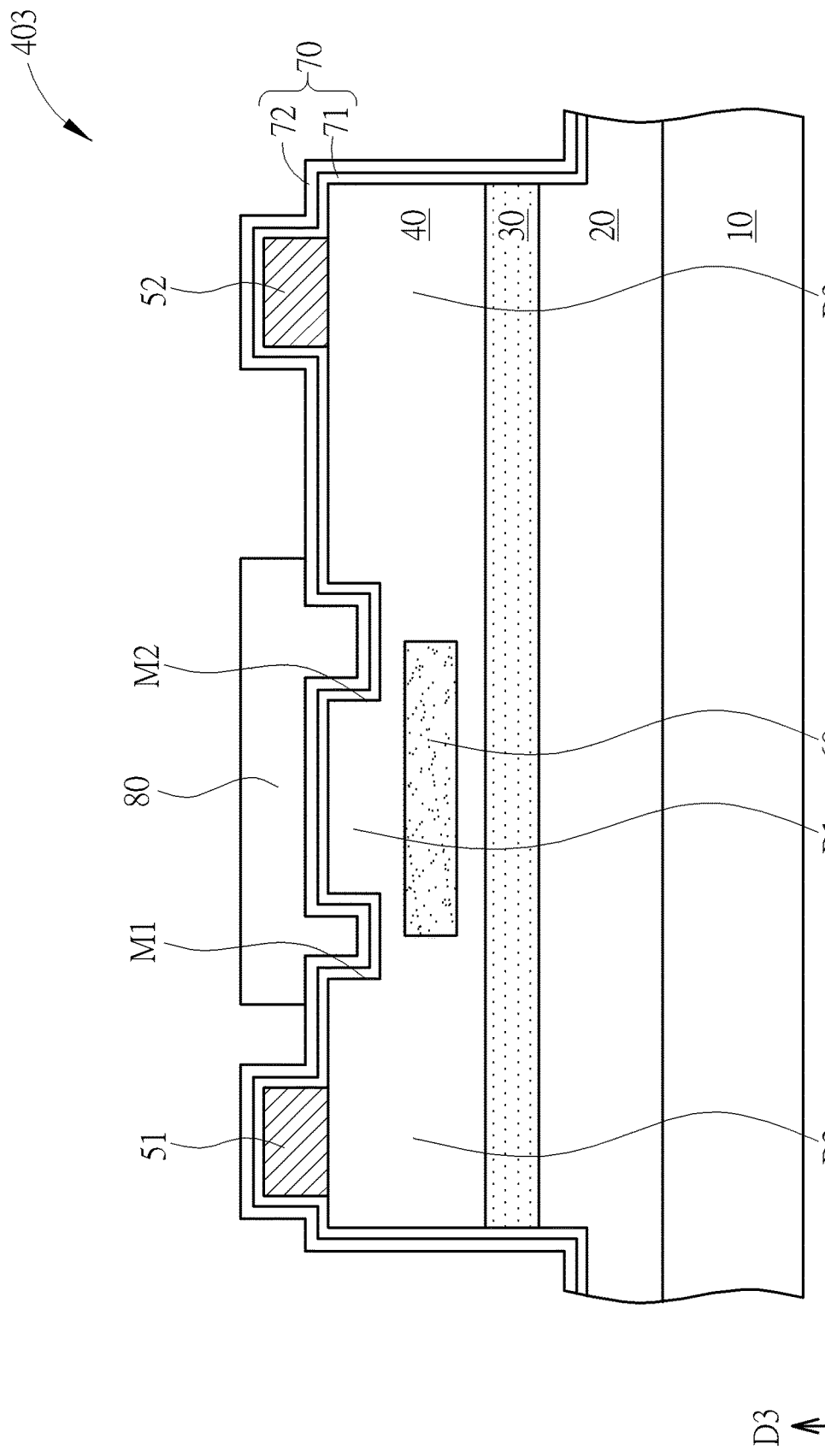
FIG. 32 is a schematic drawing illustrating an HEMT according to a twenty-second embodiment of the present invention.

Please refer to FIG. 30, FIG. 31, and FIG. 32. FIG. 30 is a schematic drawing illustrating an HEMT 401 according to a twentieth embodiment of the present invention, FIG. 31 is a schematic drawing illustrating an HEMT 402 according to a twenty-first embodiment of the present invention, and FIG. 32 is a schematic drawing illustrating an HEMT 403 according to a twenty-second embodiment of the present invention. As shown in FIG. 30, in some embodiments, the bottom surfaces of the first moat M1 and the second moat M2 may be lower than the bottommost surface of the fluorine region 60. As shown in FIG. 31, in some embodiments, the bottom surfaces of the first moat M1 and the second moat M2 may be higher than the bottommost surface of the fluorine region 60 and lower than the topmost surface of the fluorine region 60, and a part of the fluorine region 60 may be disposed under the first moat M1 and the second moat M2, but not limited thereto. As shown in FIG. 32, the bottom surfaces of the first moat M1 and the second moat M2 may be higher than the topmost surface of the fluorine region 60, and the fluorine region 60 may not contact the first moat M1 and the second moat M2. It is worth noting that damages generated by the etching process of forming the first moat M1 and the second moat M2 to the channel region may be avoided because of the relatively shallow first moat M1 and the second moat M2, and negative influence on the electrical performance of the HEMT 403 may be avoided accordingly.

Figure 33:
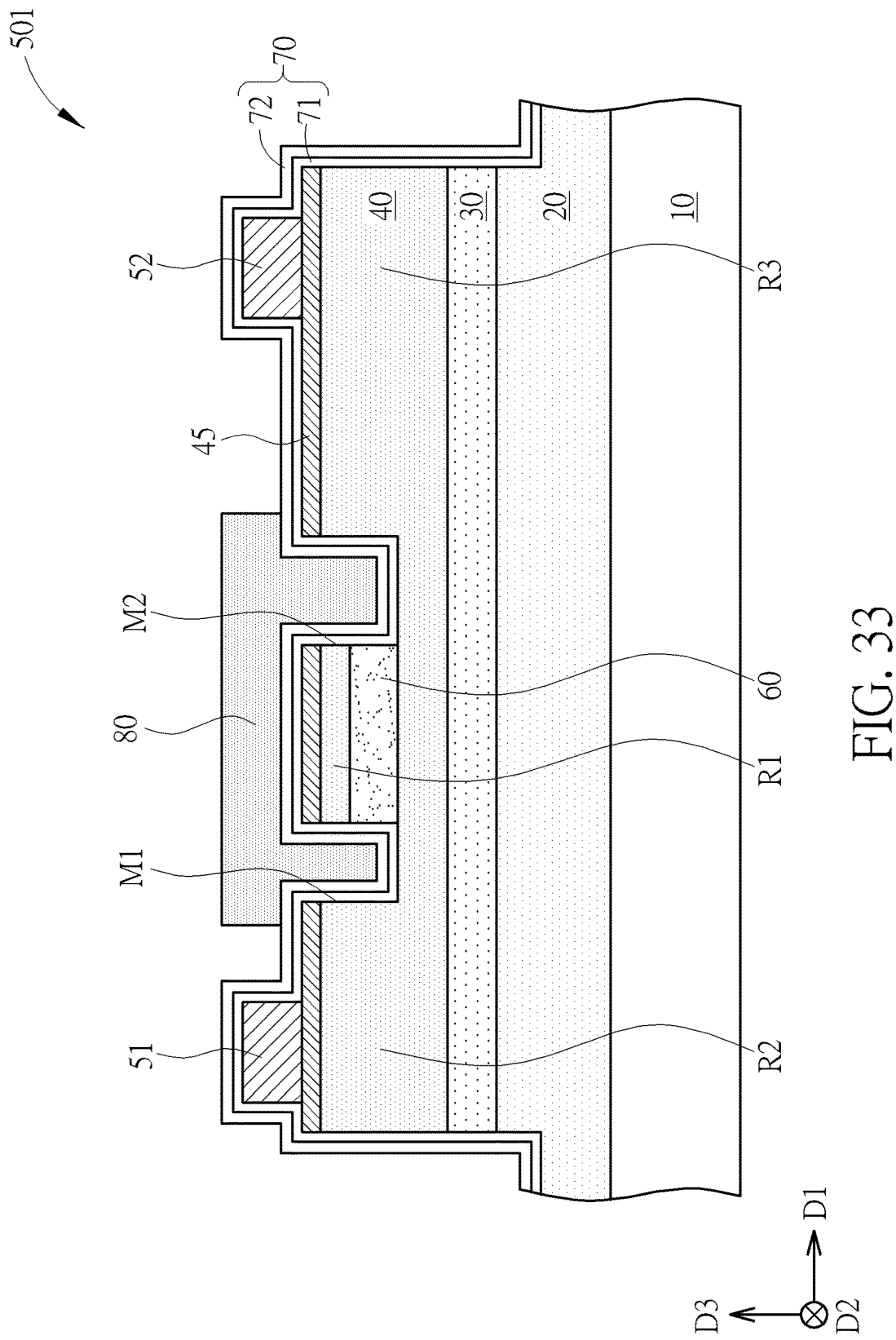
FIG. 33 is a schematic drawing illustrating an HEMT according to a twenty-third embodiment of the present invention.

Please refer to FIG. 33. FIG. 33 is a schematic drawing illustrating an HEMT according to a twenty-third embodiment of the present invention. As shown in FIG. 33, the difference between an HEMT 501 in this embodiment and the HEMT in the second embodiment mentioned above is that the HEMT 501 may further include a cap layer 45 disposed on the second III-V compound layer 40. The source electrode 51 and the drain electrode 52 are disposed on the cap layer 45, and the cap layer 45 is disposed between the gate dielectric layer 70 and the second III-V compound layer 40. The material of the cap layer 45 may include gallium nitride, aluminum nitride, aluminum gallium nitride, silicon nitride, or other suitable materials. Additionally, in some embodiments, the first moat M1 and the second moat M2 may penetrate the cap layer 45 respectively, but not limited thereto. It is worth noting that the cap layer 45 in this embodiment may also be applied to other embodiments of the present invention, such as the embodiments described above.

To summarize the above descriptions, in the HEMT of the present invention, the first moat and the second moat may be disposed in a region of the second III-V compound layer between the gate electrode and the source electrode and a region of the second III-V compound layer between the gate electrode and the drain electrode respectively. The first moat and the second moat may be used to control and/or alter the 2DEG and the electric field distribution, and the electrical performance and the reliability of the HEMT may be improved accordingly. In addition, the HEMT of the present invention may further include the fluorine region disposed in the second III-V compound layer. The first moat and the second moat may be used to form a physical restriction and/or modify the electric field distribution for reducing migrations of the fluorine ions in the fluorine region with the driving force of the generated heat and/or the electrical field especially under longer operation of the HEMT. The electrical performance and the reliability of the HEMT including the fluorine region may also be effectively enhanced accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
a first III-V compound layer;
a second III-V compound layer disposed on the first III-V compound layer, wherein the second III-V compound layer is different from the first III-V compound layer in composition;
a source electrode and a drain electrode disposed above the second III-V compound layer;
a gate electrode disposed over the second III-V compound layer located between the source electrode and the drain electrode in a first direction, wherein the second III-V compound layer comprises a first region disposed under the gate electrode;
a first moat at least partially disposed in the second III-V compound layer and at least partially disposed between the first region and the source electrode in the first direction;
a second moat at least partially disposed in the second III-V compound layer and at least partially disposed between the first region and the drain electrode in the first direction, wherein the gate electrode is partially disposed in the first moat and the second moat, and the gate electrode overlaps a part of the second III-V compound layer disposed between the first moat and the source electrode; and
a gate dielectric layer disposed on the second III-V compound layer, wherein the first moat is filled with the gate dielectric layer and the gate electrode.

2. The HEMT of claim 1, wherein the first moat and the second moat are separated from each other.

3. The HEMT of claim 1, wherein the first moat and the second moat are connected to each other.

4. The HEMT of claim 3, wherein a first moat structure comprising the first moat and the second moat surrounds the first region of the second III-V compound layer in the first direction and a second direction perpendicular to the first direction.

5. The HEMT of claim 1, further comprising:
a fluorine region disposed in the second III-V compound layer, wherein at least a part of the fluorine region is disposed in the first region of the second III-V compound layer.

6. The HEMT of claim 5, wherein at least a part of the fluorine region is disposed between the first moat and the second moat in the first direction.

7. The HEMT of claim 1, wherein a length of the first moat in the first direction is shorter than a length of the second moat in the first direction.

8. The HEMT of claim 1, wherein a length of the second moat in the first direction is shorter than a length of the first moat in the first direction.

9. The HEMT of claim 1, wherein a length of the first moat in the first direction is equal to a length of the second moat in the first direction.

10. The HEMT of claim 1, wherein the gate electrode overlaps a part of the second III-V compound layer disposed between the second moat and the drain electrode.

11. The HEMT of claim 10, further comprising:
a gate dielectric layer disposed on the second III-V compound layer, wherein the second moat is filled with the gate dielectric layer and the gate electrode.

12. The HEMT of claim 1, further comprising:
a third moat at least partially disposed in the second III-V compound layer and at least partially disposed between the first moat and the source electrode in the first direction; and
a fourth moat at least partially disposed in the second III-V compound layer and at least partially disposed between the second moat and the drain electrode in the first direction.

13. The HEMT of claim 12, wherein the third moat and the fourth moat are separated from each other.

14. The HEMT of claim 12, wherein the third moat and the fourth moat are connected to each other.

15. The HEMT of claim 14, wherein a second moat structure comprising the third moat and the fourth moat surrounds the first moat, the second moat and the first region of the second III-V compound layer.

16. The HEMT of claim 12, wherein a part of the gate electrode is disposed in the third moat.

17. The HEMT of claim 16, wherein the gate electrode overlaps a part of the second III-V compound layer disposed between the third moat and the source electrode.

18. The HEMT of claim 12, wherein a part of the gate electrode is disposed in the fourth moat.

19. The HEMT of claim 18, wherein the gate electrode overlaps a part of the second III-V compound layer disposed between the fourth moat and the drain electrode.

20. The HEMT of claim 1, further comprising:
an auxiliary electrode disposed on a part of the second III-V compound layer disposed between the second moat and the drain electrode, wherein the auxiliary electrode is electrically connected with the source electrode.

21. The HEMT of claim 1, further comprising:
a cap layer disposed on the second III-V compound layer, wherein the first moat and the second moat penetrate the cap layer respectively.

22. A high electron mobility transistor (HEMT), comprising:
a first III-V compound layer;
a second III-V compound layer disposed on the first III-V compound layer, wherein the second III-V compound layer is different from the first III-V compound layer in composition;
a source electrode and a drain electrode disposed above the second III-V compound layer;
a gate electrode disposed over the second III-V compound layer located between the source electrode and the drain electrode in a first direction, wherein the second III-V compound layer comprises a first region disposed under the gate electrode;
a first moat at least partially disposed in the second III-V compound layer and at least partially disposed between the first region and the source electrode in the first direction;
a second moat at least partially disposed in the second III-V compound layer and at least partially disposed between the first region and the drain electrode in the first direction, wherein the gate electrode is partially disposed in the first moat and the second moat, and the gate electrode overlaps a part of the second III-V compound layer disposed between the second moat and the drain electrode; and
a gate dielectric layer disposed on the second III-V compound layer, wherein the second moat is filled with the gate dielectric layer and the gate electrode.

23. A high electron mobility transistor (HEMT), comprising:
a first III-V compound layer;
a second III-V compound layer disposed on the first III-V compound layer, wherein the second III-V compound layer is different from the first III-V compound layer in composition;
a source electrode and a drain electrode disposed above the second III-V compound layer;
a gate electrode disposed over the second III-V compound layer located between the source electrode and the drain electrode in a first direction, wherein the second III-V compound layer comprises a first region disposed under the gate electrode;
a first moat at least partially disposed in the second III-V compound layer and at least partially disposed between the first region and the source electrode in the first direction;
a second moat at least partially disposed in the second III-V compound layer and at least partially disposed between the first region and the drain electrode in the first direction;
a third moat at least partially disposed in the second III-V compound layer and at least partially disposed between the first moat and the source electrode in the first direction; and
a fourth moat at least partially disposed in the second III-V compound layer and at least partially disposed between the second moat and the drain electrode in the first direction.

24. A high electron mobility transistor (HEMT), comprising:
a first III-V compound layer;
a second III-V compound layer disposed on the first III-V compound layer, wherein the second III-V compound layer is different from the first III-V compound layer in composition;
a source electrode and a drain electrode disposed above the second III-V compound layer;
a gate electrode disposed over the second III-V compound layer located between the source electrode and the drain electrode in a first direction, wherein the second III-V compound layer comprises a first region disposed under the gate electrode;
a first moat at least partially disposed in the second III-V compound layer and at least partially disposed between the first region and the source electrode in the first direction;
a second moat at least partially disposed in the second III-V compound layer and at least partially disposed between the first region and the drain electrode in the first direction; and
an auxiliary electrode disposed on a part of the second III-V compound layer disposed between the second moat and the drain electrode, wherein the auxiliary electrode is electrically connected with the source electrode.

* * * * *